(12) United States Patent
Kondo et al.

(10) Patent No.: US 8,742,568 B2
(45) Date of Patent: Jun. 3, 2014

(54) CIRCUIT BOARD, SEMICONDUCTOR DEVICE, PROCESS FOR MANUFACTURING CIRCUIT BOARD AND PROCESS FOR MANUFACTURING SEMICONDUCTOR DEVICE

(75) Inventors: Masayoshi Kondo, Tokyo (JP); Natsuki Makino, Tokyo (JP); Daisuke Fujiwara, Tokyo (JP); Yuka Ito, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 0 days.

(21) Appl. No.: 13/637,296

(22) PCT Filed: Feb. 24, 2011

(86) PCT No.: PCT/JP2011/001063
§ 371 (c)(1),
(2), (4) Date: Sep. 25, 2012

(87) PCT Pub. No.: WO2011/118128
PCT Pub. Date: Sep. 29, 2011

(65) Prior Publication Data
US 2013/0015582 A1  Jan. 17, 2013

(30) Foreign Application Priority Data

Mar. 26, 2010 (JP) ................................ 2010-071917
Oct. 28, 2010 (JP) ................................ 2010-242628

(51) Int. Cl.
*H01L 23/14* (2006.01)
*H01L 21/44* (2006.01)

(52) U.S. Cl.
USPC .... 257/702; 257/774; 257/783; 257/E23.007; 257/E23.119; 257/E21.505; 438/118; 438/110; 438/125

(58) Field of Classification Search
CPC . H01L 21/4857; H01L 24/83; H01L 2224/16; H01L 2924/07802; H01L 23/14

USPC .......... 257/702, 774, 783, E23.007, E23.119; 438/118, 125, 110

See application file for complete search history.

(56) References Cited

U.S. PATENT DOCUMENTS 5,798,563 A * 8/1998 Feilchenfeld et al. ........ 257/668
7,141,884 B2 * 11/2006 Kojima et al. ................ 257/778

(Continued)

FOREIGN PATENT DOCUMENTS

JP    10-321990 A    12/1998
JP    2002-329966 A    11/2002

(Continued)

OTHER PUBLICATIONS

PCT/ISA/210—International Search Report mailed May 24, 2011, issued in PCT/JP2011/001063.

*Primary Examiner* — Nitin Parekh

(74) *Attorney, Agent, or Firm* — Birch, Stewart, Kolasch & Birch, LLP

(57) ABSTRACT

A circuit board (1) exhibits an average coefficient of thermal expansion (A) of the first insulating layer (21) in the direction along the substrate surface in a temperature range from 25 degrees C. to its glass transition point of equal to or higher than 3 ppm/degrees C. and equal to or lower than 30 ppm/degrees C. Further, an average coefficient of thermal expansion (B) of the second insulating layer (23) in the direction along the substrate surface in a temperature range from 25 degrees C. to its glass transition point is equivalent to an average coefficient of thermal expansion (C) of the third insulating layer (25) in the direction along the substrate surface in a temperature range from 25 degrees C. to its glass transition point. (B) and (C) are larger than (A), and a difference between (A) and (B) and a difference between (A) and (C) are equal to or higher than 5 ppm/degrees C. and equal to or lower than 35 ppm/degrees C.

10 Claims, 7 Drawing Sheets

(56) References Cited

U.S. PATENT DOCUMENTS

| | | | |
|---|---|---|---|
| 7,378,745 B2 * | 5/2008 | Hayashi et al. | 257/778 |
| 7,696,007 B2 * | 4/2010 | Kikuchi et al. | 438/107 |
| 8,076,782 B2 * | 12/2011 | Asai et al. | 257/774 |
| 8,129,828 B2 * | 3/2012 | Maeda | 257/678 |
| 2005/0269698 A1 * | 12/2005 | Okada et al. | 257/737 |
| 2006/0022341 A1 * | 2/2006 | Sir et al. | 257/758 |
| 2008/0257596 A1 * | 10/2008 | Kaneko | 174/264 |
| 2009/0115067 A1 * | 5/2009 | Okimoto et al. | 257/774 |
| 2009/0243065 A1 * | 10/2009 | Sugino et al. | 257/686 |
| 2009/0267212 A1 | 10/2009 | Wada et al. | |

FOREIGN PATENT DOCUMENTS

| | | |
|---|---|---|
| JP | 2003-252951 A | 9/2003 |
| WO | WO 2007/129662 A1 | 11/2007 |
| WO | WO 2008/032620 A1 | 3/2008 |

* cited by examiner

CIRCUIT BOARD, SEMICONDUCTOR DEVICE, PROCESS FOR MANUFACTURING CIRCUIT BOARD AND PROCESS FOR MANUFACTURING SEMICONDUCTOR DEVICE

TECHNICAL FIELD

The present invention relates to a circuit board, a semiconductor device, a process for manufacturing a circuit board and a process for manufacturing a semiconductor device.

BACKGROUND ART

Conventionally, various types of substrates for installing semiconductor chips are proposed. For example, interposer substrates and the like are proposed (see Patent Document 1).

RELATED DOCUMENTS

Patent Documents

Patent Document 1
Japanese Laid-Open Patent Publication No. H10-321990

DISCLOSURE OF THE INVENTION

The producing processes practiced in recent years include a producing process for creating a larger circuit board and then installing a plurality of semiconductor chips, and thereafter dicing the circuit board to obtain individual semiconductor devices. In such producing process, a generation of a warpage of the circuit board is a considerable problem. In particular, when semiconductor chips are installed on a circuit board, the circuit board and the semiconductor chips are heated to create a solder joint between a solder layer provided in the circuit board and a metallic layer of the semiconductor chip. Then, a cooling process is conducted. At this time, a warpage is generated in the circuit board.

According to one aspect of the present invention, there is provided a circuit board, comprising: a first insulating layer, through which an electric conductor extends; a first circuit layer, provided in one side of the first insulating layer and coupled to the electric conductor; a second insulating layer, covering the first circuit layer and having an aperture formed over a portion of the first circuit layer; a second circuit layer, provided in the other side of the first insulating layer and coupled to the electric conductor; a third insulating layer, covering the second circuit layer; and a solder layer, provided in the aperture of the second insulating layer, and provided over the first circuit layer, wherein an average coefficient of thermal expansion (A) of the first insulating layer in the direction along the substrate surface in a temperature range from 25 degrees C. to its glass transition point is equal to or higher than 3 ppm/degrees C. and equal to or lower than 30 ppm/degrees C., wherein an average coefficient of thermal expansion (B) of the second insulating layer in the direction along the substrate surface in a temperature range from 25 degrees C. to its glass transition point is equivalent to an average coefficient of thermal expansion (C) of the third insulating layer in the direction along the substrate surface in a temperature range from 25 degrees C. to its glass transition point, wherein the average coefficient of thermal expansion (B) of the second insulating layer in the direction along the substrate surface in the temperature range from 25 degrees C. to its glass transition point and the average coefficient of thermal expansion (C) of the third insulating layer in the direction along the substrate surface in the temperature range from 25 degrees C. to its glass transition point are larger than the average coefficient of thermal expansion (A) of the first insulating layer, and wherein a difference between the average coefficient of thermal expansion (A) of the first insulating layer and the average coefficient of thermal expansion (B) of the second insulating layer, and a difference between the average coefficient of thermal expansion (A) of the first insulating layer and the average coefficient of thermal expansion (C) of the third insulating layer are equal to or higher than 5 ppm/degrees C. and equal to or lower than 35 ppm/degrees C.

According to the present invention, the average coefficient of thermal expansion (A) of the first insulating layer is selected to be equal to or smaller than 30 ppm/degrees C. so that a warpage generated in the first insulating layer can be inhibited.

Further, a generation of a warpage in the circuit board can be firmly inhibited by providing the second insulating layer and the third insulating layer, each of which exhibits the same average coefficient of thermal expansion and has the average coefficient of thermal expansion that is larger than that of the first insulating layer by only a predetermined amount, so as to interleave the first insulating layer therewith.

According to another aspect of the present invention, there is provided a semiconductor device, comprising: a circuit board section, obtained by segmenting the circuit board as described above; and a semiconductor chip, disposed over the circuit board, and having a size substantially equivalent to the size of the circuit board viewed from the side of the substrate surface of the circuit board section, wherein a side surface of the circuit board section and a side surface of the semiconductor chip are formed to be coplanar relation.

According to further aspect of the present invention, there is provided a method for producing a circuit board, including: a step for preparing a first insulating layer, the first insulating layer having an electric conductor extending through the inside thereof, being provided in the side of one surface thereof with a first circuit layer coupled to the electric conductor and being provided in the side of the other surface thereof with a second circuit layer coupled to the electric conductor; a step for providing a second insulating layer covering the first circuit layer; a step for providing the third insulating layer covering the second circuit layer; a step for forming an aperture in the second insulating layer, a section of the first circuit layer being exposed through the aperture; and a step for providing a solder layer in the aperture, wherein an average coefficient of thermal expansion (A) of the first insulating layer in the direction along the substrate surface in a temperature range from 25 degrees C. to its glass transition point is equal to or higher than 3 ppm/degrees C. and equal to or lower than 30 ppm/degrees C., wherein an average coefficient of thermal expansion (B) of the second insulating layer in the direction along the substrate surface in a temperature range from 25 degrees C. to its glass transition point is equivalent to an average coefficient of thermal expansion (C) of the third insulating layer in the direction along the substrate surface in a temperature range from 25 degrees C. to its glass transition point, wherein the average coefficient of thermal expansion (B) of the second insulating layer in the direction along the substrate surface in the temperature range from 25 degrees C. to its glass transition point and the average coefficient of thermal expansion (C) of the third insulating layer in the direction along the substrate surface in the temperature range from 25 degrees C. to its glass transition point are larger than the average coefficient of thermal expansion (A) of the first insulating layer, and wherein a difference between the average coefficient of thermal expansion (A) of the first insulating layer and the average coefficient of thermal expansion (B) of the second insulating layer, and a difference between the average coefficient of thermal expansion (A) of the first insulating layer and the average coefficient of thermal expansion (C) of the third insulating layer are equal to or higher than 5 ppm/degrees C. and equal to or lower than 35 ppm/degrees C. According to yet other aspect of the present invention, there is provided the method for producing the circuit board as described above, further including a step for providing a resin layer covering the second insulating layer and containing a compound having flux function on the solder layer.

According to yet other aspect of the present invention, there is provided a method for producing a semiconductor device, including a method for producing the circuit board as described above, and including: a step for disposing a plurality of semiconductor chips on the resin layer containing the compound having flux function; and a step for segmenting the circuit board to obtain a plurality of semiconductor devices comprising the semiconductor chip and the segmented circuit board.

According to the present invention, a circuit board, a semiconductor device, a process for manufacturing of circuit board and a process for manufacturing semiconductor device, all of which provide inhibition to the generation of the warpage, can be provided.

BRIEF DESCRIPTION OF THE DRAWINGS

The above and other objects, advantages and features of the present invention will be more apparent from the following description of certain preferred embodiments taken in conjunction with the accompanying drawings.

DESCRIPTION OF EMBODIMENTS

First Embodiment

Figure 1:
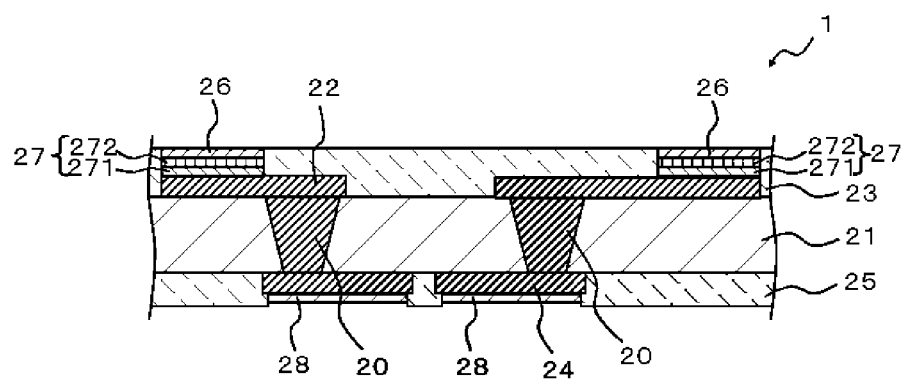
FIG. 1 is a cross-sectional view of a circuit board according to first embodiment.

First embodiment of the present invention will be described on the basis of annexed figures as follows. In the beginning, an overview of a circuit board 1 of the present embodiment will be described in reference to FIG. 1. The circuit board 1 includes: a first insulating layer 21, through which an electric conductor 20 extends; a first circuit layer 22, provided in one side of the first insulating layer 21 and coupled to the electric conductor 20; a second insulating layer 23 covering the first circuit layer 22 and having an aperture created above a portion of the first circuit layer 22; a second circuit layer 24, provided in the other side of the first insulating layer 21 and coupled to the electric conductor 20; a third insulating layer 25 covering the second circuit layer 24; and a solder layer 26 provided in the aperture of the second insulating layer 23. An average coefficient of thermal expansion (A) of the first insulating layer 21 in the direction along the substrate surface in a temperature range from 25 degrees C. to equal to or lower than its glass transition point is equal to or higher than 3 ppm/degrees C and equal to or lower than 30 ppm/degrees C. An average coefficient of thermal expansion (B) of the second insulating layer 23 in the direction along the substrate surface in a temperature range from 25 degrees C. to equal to or lower than its glass transition point is equivalent to an average coefficient of thermal expansion (C) of the third insulating layer 25 in the direction along the substrate surface in a temperature range from than 25 degrees C. to its glass transition point. In addition, the average coefficient of thermal expansion (B) of the second insulating layer 23 in the direction along the substrate surface in the temperature range from 25 degrees C. to its glass transition point and the average coefficient of thermal expansion (C) of the third insulating layer 25 in the direction along the substrate surface in the temperature range from 25 degrees C. to its glass transition point are larger than the average coefficient of thermal expansion (A) of the aforementioned first insulating layer 21, and the difference between the average coefficient of thermal expansion (A) of the first insulating layer 21 and the average coefficient of thermal expansion (B) of the second insulating layer 23 and the difference between the aforementioned average coefficient of thermal expansion (A) of the aforementioned first insulating layer 21 and the average coefficient of thermal expansion (C) of the third insulating layer 25 are equal to or higher than 5 ppm/degrees C. and equal to or lower than 35 ppm/degrees C. Here, the average coefficient of thermal expansion can be determined by the following method. A sample specimen of 5 mm square is cut out from the respective insulating layers, and a thermomechanical analyzer (TMA) (commercially available from TA Instruments) is employed to measure a displacement of the sample specimen in the direction along the surface while the sample specimen is heated at a temperature starting from 25 degrees C. and at a rate of 5 degrees C./minute. Then, the average coefficient of thermal expansion in the direction along the substrate surface in the temperature range from 25 degrees C. to its glass transition point is calculated.

The circuit board 1 referring to here also includes, in addition to the conformation including the second insulating layer 23 and the third insulating layer 25 formed as shown in FIG. 1, a conformation including a resin layer 3 having flux function as discussed later shown in FIG. 5. The circuit boards of both conformations can be supplied as commercial conformations to assembly manufacturers who install the semiconductor chips. Hereinafter, it is assumed that the circuit board 1 include both conformations as long as there is no particular indication.

In the next, the circuit board 1 of the present embodiment will be described in detail.

(First Insulating Layer 21)

The first insulating layer 21 exhibits an average coefficient of thermal expansion (A) in the direction along the substrate surface in the temperature range from 25 degrees C. and to its glass transition point of equal to or higher than 3 ppm/degrees C. and equal to or lower than 30 ppm/degrees C. A creation of a warpage of the circuit board 1 can be inhibited by providing the average coefficient of thermal expansion (A) of equal to or lower than 30 ppm/degrees C. In addition, the difference in the coefficient of thermal expansion from that of the installed semiconductor chips 5 (see FIG. 6) can be reduced by providing the average coefficient of thermal expansion (A) of equal to or higher than 3 ppm/degree C. to reduce a force exerted over the semiconductor chips 5. In addition to above, the average coefficient of thermal expansion (A) in the direction along the substrate surface in the temperature range from 25 degrees C. to its glass transition point is preferably equal to or higher than 3 ppm/degrees C. and equal to or lower than 20 ppm/degrees C. Further, the first insulating layer 21 may preferably exhibit an average coefficient of thermal expansion in a direction (thickness direction) perpendicular to the direction along the substrate surface in the temperature range from 25 degrees C. to its glass transition point of equal to or higher than 3 ppm/degrees C. and equal to or lower than 30 ppm/degrees C. Having such configuration, a warpage can be prevented, and reliability on the temperature cycling tests for the semiconductor device 6 can be improved.

Typical resin composition constituting the insulating layer 21 may include a product containing, for example, (a) a novolac based epoxy resin, (b) a curing agent and (c) an inorganic filler While the type of the (a) novolac based epoxy resin is not particularly limited, typical examples include, for example, phenolic novolac based epoxy resin, creosol novolac based epoxy resin, biphenyl aralkyl novolac based epoxy resin, naphthalene aralkyl novolac based epoxy resin, dicyclopenta diene novolac based epoxy resin and the like. One of these epoxy resins may be employed alone, or two or more of these epoxy resins having different weight-average molecular weights may also be employed together, or a combination of one, two or more of these epoxy resins and a prepolymer thereof may also be employed. Among these epoxy resins, novolac based epoxy resins having methylene bond such as biphenyl aralkyl novolac based epoxy resin, naphthalene aralkyl novolac based epoxy resin and the like exhibit improved thermal resistance and improved fire retardancy, and among these, biphenyl aralkyl novolac based epoxy resin is preferable.

The type of the aforementioned biphenyl aralkyl novolac based epoxy resin is an epoxy resin having one or more biphenyl alkylene group in its repeating unit. The biphenyl aralkyl novolac based epoxy resin is, for example, xylylene based epoxy resin, biphenyl dimethylene based epoxy resin or the like. Among these, biphenyl dimethylene based epoxy resin is preferable. Biphenyl dimethylene based epoxy resin may be represented by, for example, the formula (III).

than the aforementioned upper limit, the flowability of the resin is deteriorated, possibly causing a molding failure.

The content of the (a) novolac based epoxy resin is preferably equal to or larger than 1% wt. and equal to or smaller than 55% wt. of the whole resin composition, and more preferably equal to or larger than 5% wt. and equal to or smaller than 40% wt., though is not particularly limited thereto. If the content is lower than the above-described lower limit, the moisture resistance of the obtained product may be deteriorated, and if the content is higher than the above-described upper limit, the heat resistance may be deteriorated.

The weight-average molecular weight of the (a) novolac based epoxy resin is preferably equal to or larger than $5.0 \times 10^2$ and equal to or smaller than $2.0 \times 10^4$ and more preferably equal to or larger than $8.0 \times 10^2$ and equal to or smaller than $1.5 \times 10^4$, though is not particularly limited thereto. If the weight-average molecular weight is lower than the above-described lower limit, a tackiness may be caused, and if the weight-average molecular weight is higher than the above-described upper limit, reduced impregnation into the base material may be occurred when a prepreg is manufactured, thereby failing to obtain uniform products.

The weight-average molecular weight of the (a) novolac based epoxy resin may be measured with, for example, a gel permeation chromatography (GPC, reference material: polystyrene conversion).

Further, the aforementioned resin composition may preferably contain (c) inorganic filler. This allows obtaining sufficient strength even if the thickness of the circuit board 1 is reduced (equal to or lower than thickness 0.4 mm). Further, reduction in the thermal expansion of the entire circuit board 1 can be improved.

Compounds, which is capable of reacting with epoxy group of the (a) novolac epoxy resin (for example, phenolic resin), or curing accelerators, which accelerates the reaction between epoxy groups (for example, imidazole), may be employed for the (b) curing agent.

Examples of the aforementioned phenolic resins include, for example: novolac based phenolic resins such as phenolic

[chem. 1]

Formula (III)

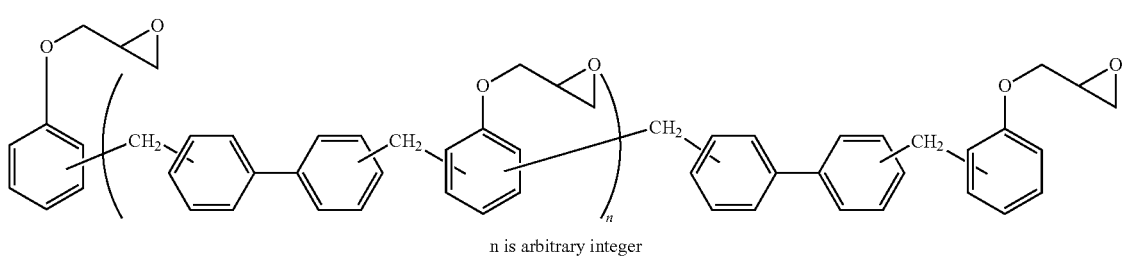

n is arbitrary integer

The average number "n" of repeating units of biphenyl dimethylene based epoxy resin represented by the aforementioned formula (III) is preferably equal to or larger than 1 and equal to or smaller than 10, and more preferably equal to or larger than 2 and equal to or smaller than 5, though is not particularly limited thereto. If the average number "n" of repeating units is lower than the above-described lower limit, the biphenyl dimethylene based epoxy resin is easily crystallized to relatively deteriorate a solubility thereof for a general purpose solvent, possibly causing a difficulty in the handling. Further, if the average number "n" of repeating units is higher novolac resin, creosol novolac resin, bisphenol A novolac resin, aryl alkylene based novolac resin and the like; resol based phenolic resins such as unmodified resol phenolic resin, oil-modified resol phenolic resin, which is modified with tung oil, flaxseed oil, walnut oil or the like, though is not particularly limited thereto. One of these epoxy resins may be employed alone, or two or more of these epoxy resins having different weight-average molecular weights may also be employed together, or a combination of one, two or more of these epoxy resins and a prepolymer thereof may also be employed. Among these, aryl alkylene based phenolic resin is particularly preferable.

While the aforementioned curing accelerator is not particularly limited, typical examples of the curing accelerator include, for example: organometallic salts such as zinc naphthenate, cobalt naphthenate, stannous octoate, cobalt octoate, bisacetylacetonato cobalt (II), trisacetylacetonato cobalt (III) and the like; tertiary amines such as triethylamine, tributyl amine, diazabicyclo[2,2,2]octane and the like; imidazoles such as 2-methyl imidazole, 2-phenylimidazole, 2-phenyl-4-methyl imidazole, 2-ethyl-4-ethylimidazole, 1-benzil-2-methyl imidazole, 1-benzil-2-phenylimidazole, 2-undecyl imidazole, 1-cyanoethyl-2-ethyl-4-methyl imidazole, 1-cyanoethyl-2-undecyl imidazole, 2-phenyl-4-methyl-5-hydroxy imidazole, 2-phenyl-4,5-dihydroxy imidazole, 2,3-dihydro-1H-pyrrolo(1,2-a)benzimidazole and the like; phenolic compounds such as phenol, bisphenol A, nonylphenol and the like; organic acids such as acetic acid, benzoic acid, salicylic acid, paratoluenesulfonic acid and the like; and mixtures thereof. One compound in these chemical compounds and derivatives thereof may be employed alone, or two or more compounds in these chemical compounds and derivatives thereof may also be employed together.

While the (c) inorganic filler is not particularly limited, typical examples of (c) inorganic filler include, for example: silicates such as talc, burnt talc, burnt or calcined clay, unburnt clay, mica, glass and the like; oxides such as titanium oxide, alumina, silica, fused silica and the like; carbonates such as calcium carbonate, magnesium carbonate, hydrotalcite and the like; hydroxides such as aluminum hydroxide, magnesium hydroxide, calcium hydroxide and the like; sulfates or sulfites such as barium sulfate, calcium sulfate, calcium sulfite and the like; borates such as zinc borate, barium metaborate, aluminum borate, calcium borate, sodium borate and the like; nitrides such as aluminum nitride, boron nitride, silicon nitride, carbon nitride and the like; and titanates such as strontium titanate, barium titanate and the like. One of these (c) inorganic fillers may be employed alone, or two or more of these may also be employed together. Among these, magnesium hydroxide, aluminum hydroxide, silica, fused silica, talc, burnt talc and alumina are preferable, and fused silica is particularly preferable in view of achieving reduced thermal expansion.

The shape thereof, including crushed form and spherical form, is suitably selected to be used in accordance with the objectives, typical example of which is that the spherical silica is employed in order to reduce a melt viscosity of a resin composition for ensuring better impregnation ability to a fiber base material.

The content of the (c) inorganic filler is preferably equal to or higher than 20% wt. and equal to or lower than 80% wt. of the whole resin composition and more preferably equal to or higher than 30% wt. and equal to or lower than 75% wt., though is not particularly limited thereto. The content within the above-described range provides, in particular, reduced thermal expansion and reduced water absorption.

A thermosetting resin (halogen is not substantially contained) may be preferably employed in addition to the novolac based epoxy resin for the resin composition constituting the first insulating layer 21. Examples of the aforementioned thermosetting resin typically include, for example, resins having triazine ring such as urea resin, melamine resin and the like, unsaturated polyester resin, bismaleimide resin, polyurethane resin, diallyphthalate resin, silicone resin, resin having benzoxazin ring, cyanate resin and the like. One of these resins may be employed alone, or two or more of these resins having different weight-average molecular weights may also be employed together, or a combination of one, two or more of these resins and a prepolymer thereof may also be employed together. Among these, cyanate resin (including prepolymer of the cyanate resin) is particularly preferable. This provides reduced coefficient of thermal expansion of the first insulating layer 21. Further, this also provides enhanced electrical characteristics (reduced dielectric constant, reduced dielectric loss tangent) and enhanced mechanical strengths of the first insulating layer 21.

The aforementioned cyanate resin can be obtained by conducting a pre-polymerization through, for example, a reaction between a halogenated cyanide compound and phenol with a treatment such as heating or the like as required. More specifically, examples of the cyanate resin typically include bisphenol based cyanate resins such as novolac based cyanate resin, bisphenol A based cyanate resin, bisphenol E based cyanate resin, tetramethyl bisphenol F based cyanate resin and the like. Among these, novolac based cyanate resin is preferable. This provides improved thermal resistance due to enhanced cross-linking density, and improved fire retardancy of the resin composition. It is considered that this is because the novolac based cyanate resin is easily carbonized since triazine ring is particularly created in the curing reaction so that the resin contains benzene ring at higher rate. Further, enhanced stiffness during the heating process allows providing particularly enhanced reliability semiconductor when the semiconductor chips are installed.

Compounds shown in, for example, formula (I) may be employed for the aforementioned novolac based cyanate resin.

[chem. 2]

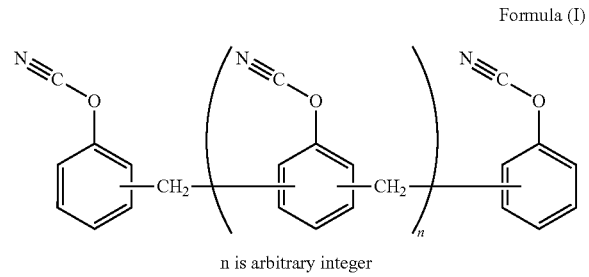

Formula (I)

n is arbitrary integer

Average number "n" of repeating units of the novolac cyanate resin represented by the aforementioned formula (I) may be preferably equal to or greater than 1 and equal to or smaller than 10, and more preferably equal to or greater than 2 and equal to or smaller than 7, though is not particularly limited thereto. If the average number "n" of repeating units is lower than the above-described lower limit, the thermal resistance of the novolac based cyanate resin is reduced, possibly causing elimination and/or vaporization of low molecular weight components. Further, if the average number "n" of repeating units is higher than the aforementioned upper limit, the melt viscosity is excessively increased, possibly deteriorating a formability of the first insulating layer 21. The content of the aforementioned cyanate resin is preferably equal to or higher than 5% wt. and equal to or lower than 42% wt. of the whole resin composition and more preferably equal to or higher than 10% wt. and equal to or lower than 40% wt., though is not particularly limited thereto. The content of lower than the above-described lower limit may provide increased coefficient of thermal expansion, and the content of higher than the aforementioned upper limit may provide reduced humidity resistance.

The first insulating layer 21 may be constituted of a prepreg, which is prepared by impregnating the aforementioned resin composition as described above in a base material.

While the aforementioned base material is not particularly limited, typical base material is, for example: glass fiber base material such as glass cloth, glass nonwoven fabric or the like; polyamide based resin fiber such as polyamide resin fiber, aromatic polyamide resin fiber, wholly aromatic polyamide resin fiber or the like; polyester based resin fiber such as polyester resin fiber, aromatic poly ester resin fiber, wholly aromatic polyester resin fiber or the like; synthetic fiber base material composed of a woven cloth or a nonwoven fabric containing polyimide resin fiber, fluororesin fiber or the like as a major constituent; or organic fiber base material such as a paper base material or the like containing craft paper, cotton linter paper, mix paper of linter and kraft pulp or the like as a major constituent. Among these, glass fiber base material is preferable. This allows providing enhanced strength and reduced water absorption of the prepreg. In addition, this also allows providing reduced coefficient of thermal expansion of the prepreg.

In addition to above, the following resin film may be employed for the first insulating layer 21. Typical resin film is, for example: polyimide resin based resin film such as polyimide resin film, polyetherimide resin film, polyamide imide resin film or the like; polyamide resin based film such as polyamide resin film or the like; or polyester resin based film such as polyester resin film or the like. Among these, the polyimide resin based film is basically preferable. This allows providing particularly improved elastic modulus and thermal resistance.

Thickness of the first insulating layer 21 as described above is, for example, on the order of 40 μm. In addition, the electric conductor 20 extends through the interior of the first insulating layer 21. The electric conductor 20 is configured of a via of a metal, for example, copper, and is coupled to the first circuit layer 22 and the second circuit layer 24, which are provided in the front and the back surfaces of first insulating layer 21, respectively. Each of the first circuit layer 22 and the second circuit layer 24 is a metallic circuit, for example, a circuit of copper.

(Second Insulating Layer 23, Third Insulating Layer 25)

The second insulating layer 23 covers the first circuit layer 22 and has an aperture formed in a section positioned above a portion of the first circuit layer 22. Further, the inside of the aperture is provided with a metallic layer 27 coupled to the first circuit layer 22 and a solder layer 26 provided on the metallic layer 27. The metallic layer 27 has a multiple-layered structure of, for example, a copper layer 271, a nickel layer 272 and the like. The third insulating layer 25 covers the second circuit layer 24 and has an aperture formed in a section of the second circuit layer 24 positioned in an opposing side to the first insulating layer 21. Further, a metallic layer 28 coupled to the second circuit layer 24 is formed in the aperture. The metallic layer 28 is configured of, for example, a gold-plated layer. Further, the average coefficient of thermal expansion (B) of the second insulating layer 23 in the direction along the substrate surface in the temperature range from 25 degrees C. to its glass transition point is equivalent to the average coefficient of thermal expansion (C) of the third insulating layer 25 in the direction along the substrate surface in the temperature range from 25 degrees C. to its glass transition point. Here, "the average coefficient of thermal expansion" "is equivalent to" as described above includes substantially equivalent within the range of an error in the measurement of the coefficient of thermal expansion. For example, the second insulating layer 23 and the third insulating layer 25 are composed of the same resin composition. In addition to above, this includes a situation where the average coefficient of thermal expansion (B) of the second insulating layer 23 in the direction along the substrate surface in the temperature range from 25 degrees C. to its glass transition point is equivalent to the average coefficient of thermal expansion (C) of the third insulating layer 25 in the direction along the substrate surface in the temperature range from 25 degrees C. to its glass transition point within a range of an error, due to the difference of the content ratio of the resin compositions between the second insulating layer 23 and the third insulating layer 25. Further, the average coefficient of thermal expansion (B) of the second insulating layer 23 in the direction along the substrate surface in the temperature range from 25 degrees C. and to its glass transition point and the average coefficient of thermal expansion (C) of the third insulating layer 25 in the direction along the substrate surface in the temperature range from 25 degrees C. to its glass transition point are larger than the average coefficient of thermal expansion (A) of the first insulating layer 21. Having such configuration, the second insulating layer 23 and the third insulating layer 25, both of which have the same average coefficient of thermal expansion, are disposed symmetrically across the first insulating layer 21, so that a generation of a warpage of the circuit board 1 is inhibited.

More specifically, each of the average coefficient of thermal expansion (B) of the second insulating layer 23 and the average coefficient of thermal expansion (C) of the third insulating layer 25 may be preferably equal to or higher than 20 ppm/degree C. and equal to or lower than 40 ppm/degree C., and more preferably equal to or higher than 25 ppm/degrees C. and equal to or lower than 35 ppm/degrees C. The average coefficient of thermal expansion of equal to or lower than 40 ppm/degree C. allows reducing a generation of a warpage of the circuit board 1. On the other hand, the average coefficient of thermal expansion of equal to or higher than 20 ppm/degree C. provides an advantageous effect of reducing an inter-layer distortion of the first insulating layer 21 and a flux active resin layer 3 when the flux active resin layer 3 is formed on the solder layer so as to cover the second insulating layer 23 as described later. Further, it is also preferable that the second insulating layer 23 and the third insulating layer 25 have the average coefficient of thermal expansion in the direction perpendicular to the substrate surface (thickness direction) in the temperature range from 25 degrees C. and equal to its glass transition point of equal to or lower than 30 ppm/degree C. and equal to or higher than 3 ppm/degree C. This allows reducing the warpage and providing improved reliability for the heat cycle test of the semiconductor device 6.

Further, the difference between the average coefficient of thermal expansion (A) of the first insulating layer 21 and the average coefficient of thermal expansion (B) of the second insulating layer 23, and the difference between the average coefficient of thermal expansion (A) of the first insulating layer 21 and the average coefficient of thermal expansion (C) of the third insulating layer 25 are equal to or higher than 5 ppm/degree C. and equal to or lower than 35 ppm/degree C. The difference between the average coefficient of thermal expansion (A) of the first insulating layer 21 and the average coefficient of thermal expansion (B) of the second insulating layer 23, and the difference between the average coefficient of thermal expansion (A) of the first insulating layer 21 and the average coefficient of thermal expansion (C) of the third insulating layer 25 are designed to be equal to or higher than 5 ppm/degree C. to provide an advantageous effect of reducing an inter-layer distortion of the first insulating layer 21 and the resin layer 3 for contacting with the semiconductor chip 5 as described later. Since the resin layer 3 for contacting with the semiconductor chip 5 has the coefficient of thermal expansion in the direction along the substrate surface in the temperature range from 25 degrees C. to its glass transition point, which is larger than that of the first insulating layer 21, the aforementioned difference is selected to be equal to or higher than 5 ppm/degree C. to allow reducing an inter-layer distortion between the first insulating layer 21 and the resin layer 3. On the other hand, the difference between the average coefficient of thermal expansion (A) of the first insulating layer 21 and the average coefficient of thermal expansion (B) of the second insulating layer 23 and the difference between the aforementioned average coefficient of thermal expansion (A) of the first insulating layer 21 and the average coefficient of thermal expansion (C) of the third insulating layer 25 is selected to be equal to or lower than 35 ppm/degree C. to provide an advantageous effect of reducing a warpage. In particular, it is preferable that the difference between the average coefficient of thermal expansion (A) of the first insulating layer 21 and the average coefficient of thermal expansion (B) of the second insulating layer 23 and the difference between the average coefficient of thermal expansion (A) of the first insulating layer 21 and the average coefficient of thermal expansion (C) of the third insulating layer 25 are equal to or higher than 10 ppm/degree C. and equal to or lower than 20 ppm/degree C.

Further, it is preferable that the thickness (T1) of the second insulating layer 23 is equal to or larger than 10 μm and equal to or smaller than 100 μm, and the thickness (T2) of the third insulating layer 25 is equal to or larger than 10 μm and equal to or smaller than 100 μm. Here, while the thickness (T1) of the second insulating layer 23 may be equivalent to the thickness (T2) of the third insulating layer 25, it is preferable that the thickness (T1) of the second insulating layer 23 is different from the thickness (T2) of the third insulating layer 25. T1/T2, which is a ratio of the thickness (T1) of the second insulating layer 23 with the thickness (T2) of the third insulating layer 25, is preferably equal to or higher than 1. T1/T2 is selected to be equal to or higher than 1 to provide an advantageous effect of reducing a warpage. Besides, a warpage may be caused in the circuit board 1, due to a difference in the patterns of the first circuit layer 22 and the second circuit layer 24, which are provided in the front and the back surfaces of first insulating layer 21, respectively, or due to a difference between the rate of the apertures formed in the second insulating layer 23 and the rate of the apertures formed in the third insulating layer 25. In order to inhibit a generation of such warpage, the second insulating layer 23 may be selected to have a thickness that is not equivalent to the thickness of the third insulating layer 25, or in particular, T1/T2 may be selected to be equal to or higher than 1 by, in particular, selecting different thicknesses, so that the circuit board 1 exhibiting improved flatness can be obtained. In addition, the thicknesses of the second insulating layer 23 and the third insulating layer 25 may be thinner than that of the first insulating layer 21, and may preferably equal to or larger than one-tenth of the thickness of the first insulating layer 21. This provides an advantageous effect of reducing a warpage.

The second insulating layer 23 and the third insulating layer 25 as described above may be preferably composed of a resin composition, instead of a prepreg. The second insulating layer 23 and the third insulating layer 25 may be composed of the same resin composition. The second insulating layer 23 and the third insulating layer 25 may be composed of a resin composition containing, for example, (d) a polyfunctional cyanate resin, (e) a novolac based epoxy resin having condensed aromatic hydrocarbon structure, (f) a phenoxy resin having bisphenol acetophenone structure represented by the following general formula (1), and (g) an inorganic filler as an essential constituents.

[chem. 3]

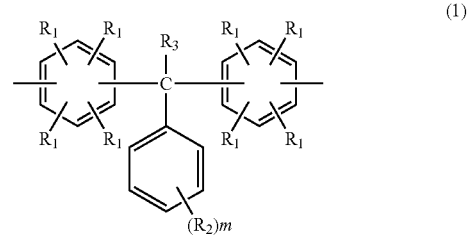

(where, in the formula: each of $R_1$ may be identical or may be different, and is a group selected from atomic hydrogen, hydrocarbon group having equal to or more than 1 and equal to or less than 10 carbon atoms and halogen; $R_2$ is a group selected from atomic hydrogen, hydrocarbon group having equal to or more than 1 and equal to or less than 10 carbon atoms and halogen; and $R_3$ is atomic hydrogen or hydrocarbon group having equal to or more than 1 and equal to or less than 10 carbon atoms; and m is an integer number of 0 to 5).

The use of such resin composition provides enhanced insulating reliability. In addition, this also provides improved adhesiveness with the resin layer 3.

The aforementioned (d) polyfunctional cyanate resin is a resin having two or more of cyanate groups (—O—CN) in a single molecule. Examples of (d) polyfunctional cyanate resin include, for example, 2,2'-bis(4-cyanatophenyl)isopropylidene, 1,1'-bis(4-cyanatophenyl)ethane, bis(4-cyanato-3,5-dimethylphenyl)methane, 1,3-bis(4-cyanatophenyl-1-(1-methylethylidene))benzene, dicyclopentadiene based cyanate ester, phenol novolac based cyanate ester, bis(4-cyanatophenyl)thioether, bis(4-cyanatophenyl)ether, 1,1,1-tris(4-cyanatophenyl)ethane, tris(4-cyanatophenyl)phosphite, bis(4-cyanatophenyl)sulfone, 2,2-bis(4-cyanatophenyl)propane, 1,3-, 1,4-, 1,6-, 1,8-, 2,6- or 2,7-dicyanatonaphthalene, 1,3,6-tricyanatonaphthalene, 4,4'-dicyanatobiphenyl, and a cyanate ester resin obtained by a reaction of polyphenols of novolac, or cresol novolac phenols with halogen cyanide, and the like. Among these, phenol novolac based cyanate ester resin provides enhanced fire retardancy and reduced thermal expansion, and 2,2'-bis(4-cyanatophenyl)isopropylidene and dicyclopentadiene based cyanate ester provide enhanced controllability for the cross-link density and enhanced moisture resistance reliability. In the present embodiment, phenol novolac based cyanate ester resin is preferable due to its reduced thermal expansion. In addition, one, two or more of other types of cyanate ester resins may be use together, though it is not particularly limited thereto.

Further, a pre-polymerized compound of the aforementioned (d) polyfunctional cyanate resin may also be employed. More specifically, the aforementioned polyfunctional cyanate resin may be employed alone, the polyfunctional cyanate resins having different weight-average molecular weights may be employed together, or the aforementioned polyfunctional cyanate resin and the prepolymer thereof may also be employed together. The aforementioned prepolymer can be ordinarily obtained by, for example, trimerizing the aforementioned polyfunctional cyanate resin by a thermal reaction. This is preferably employed in order to adjust the formability and the flowability of the resin composition. While the type of the aforementioned prepolymer is not limited, the use of, for example, a prepolymer having the trimerized rate of equal to or higher than 20% wt. and equal to or lower than 50% wt. achieves improved formability and flowability.

The content of the aforementioned (d) polyfunctional cyanate resin may be preferably equal to or higher than 10% wt. and equal to or lower than 60% wt. of the resin composition except the (g) inorganic filler, and more preferably equal to or higher than 20% wt. and equal to or lower than 50% wt., though is not particularly limited thereto. The content of lower than the above-described lower limit may cause deterioration of the lower thermal expansion or deterioration of the thermal resistance. On the other hand, the content of higher than the above-described upper limit may cause deterioration of the strength of the insulating resin layer or deterioration of the mechanical strength.

The aforementioned (e) novolac based epoxy resin having condensed aromatic hydrocarbon structure is a novolac based epoxy resin that has condensed aromatic hydrocarbon structure such as naphthalene, anthracene, phenanthrene, tetracene, chrysene, pyrene, triphenylene or tetraphene, or the others. A plurality of aromatic rings can be regularly arranged in a molecule of the aforementioned (e) novolac based epoxy resin having condensed aromatic hydrocarbon structure, and therefore reduced thermal expansion is achieved. The resin also exhibits higher glass transition temperature, so that enhanced thermal resistance is achieved. Further, the resin also has larger molecular weight of the constitutional repeating unit, so that enhanced fire retardancy is achieved, as compared with the conventional novolac based epoxy. In addition, the resin can also be used in combination with a cyanate resin to provide an improvement in the mechanical weakness of the cyanate resin, which is a drawback of the cyanate resin. Therefore, the use of the resin together with the aforementioned (d) polyfunctional cyanate resin provides further enhanced glass transition temperature, so that better reliability of a lead-free installation can be achieved.

The aforementioned (e) novolac based epoxy resin having condensed aromatic hydrocarbon structure is obtained by an epoxidation of a novolac based phenolic resin, which is synthesized from a phenol compound, a formaldehyde compound, and a condensed aromatic hydrocarbon compound.

Examples of the aforementioned phenol compound typically include, for example: phenol; cresols such as o-cresol, m-cresol, p-cresol and the like; xylenols such as 2,3-xylenol, 2,4-xylenol, 2,5-xylenol, 2,6-xylenol, 3,4-xylenol, 3,5-xylenol and the like; trimethylphenols such as 2,3,5-trimethylphenol and the like; ethylphenols such as o-ethylphenol, m-ethylphenol, p-ethylphenol and the like; alkylphenols such as isopropylphenol, butylphenol, t-butylphenol and the like; o-phenylphenol; m-phenylphenol; p-phenylphenol; catechol; naphthalenediols such as 1,5-dihydroxynaphthalene, 1,6-dihydroxynaphthalene, 2,7-dihydroxynaphthalene and the like; polyphenols such as resorcin, catechol, hydroquinone, pyrogallol, phloroglucin and the like; and alkylpolyphenols such as alkyl resorcin, alkyl catechol, alkyl hydroquinone and the like, though is not particularly limited thereto. Among these, phenol is preferable, due to the cost and the advantageous effect for the decomposition reaction.

Examples of the aforementioned aldehydes compound typically include, for example, formaldehyde, paraformaldehyde, trioxane, acetaldehyde, propionaldehyde, polyoxymethylene, chloral, hexamethylene tetramine, furfural, glyoxal, n-butylaldehyde, caproaldehyde, allylaldehyde, benzaldehyde, crotonaldehyde, acrolein, tetraoxymethylene, phenylacetaldehyde, o-tolualdehyde, salicylaldehyde, dihydroxybenzaldehyde, trihydroxybenzaldehyde, 4-hydroxy-3-methoxyaldehyde, paraformaldehyde and the like, though is not particularly limited thereto.

Examples of the aforementioned condensed aromatic hydrocarbon compound typically include for example: naphthalene derivatives such as methoxynaphthalene, butoxy naphthalene and the like; anthracene derivatives such as methoxy anthracene and the like; phenanthrene derivatives such as methoxy phenanthrene and the like, and additionally tetracene derivatives, chrysene derivatives, pyrene derivatives, derivative triphenylenes, tetraphene derivatives and the like, though is not particularly limited thereto.

Examples of the aforementioned (e) novolac based epoxy resin having condensed aromatic hydrocarbon structure typically include, for example, methoxynaphthalene-modified orthocresol novolac epoxy, butoxynaphthalene-modified meta(para)cresol novolac epoxy, and methoxynaphthalene-modified novolac epoxy and the like, though is not particularly limited thereto. Among these, novolac based epoxy resin having condensed aromatic hydrocarbon structure represented by the following formula (2) is preferable.

[chem. 4]

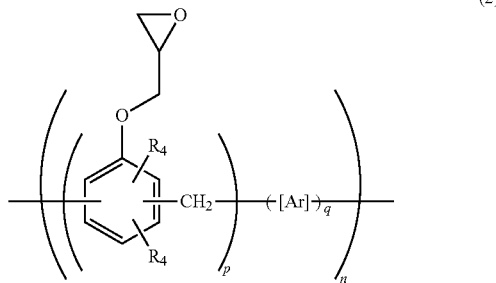

(2)

(where, in the formula: Ar is condensed aromatic hydrocarbon group; each of $R_4$ may be identical or may be different, and is a group selected from atomic hydrogen, hydrocarbon group having equal to or more than 1 and equal to or less than 10 carbon atoms, halogen element, aryl group such as phenyl group, benzyl group and the like, and organic group including glycidyl ether; n, p and q are integer number of 1 or higher; and each of p and q in each of the constitutional repeating unit may be identical or may be different.)

Ar may be preferably one of the structures represented by $(Ar_1)$ to $(Ar_4)$ shown in the following (3).

[chem. 5]

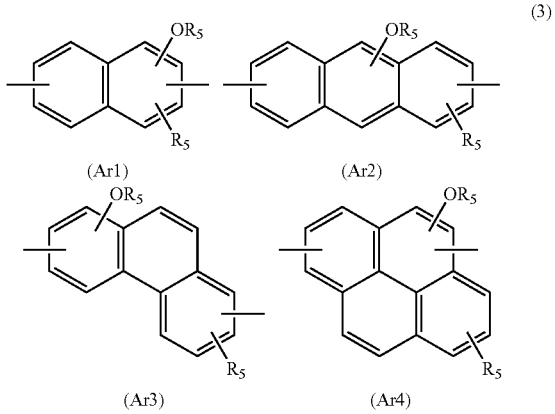

(3)

(Ar1)  (Ar2)

(Ar3)  (Ar4)

(where, in the formula, each of $R_5$ may be identical or may be different, and is a group selected from atomic hydrogen, hydrocarbon group having equal to or more than 1 and equal to or less than 10 carbon atoms, halogen element, aryl group such as phenyl group, benzyl group and the like, and organic group including glycidyl ether.)

Among these, it is preferable that $R_4$ is alkyl group such as methyl group, ethyl group, isopropyl group or the like, p is equal to or larger than 1 and equal to or lower than 2, q is equal to or larger than 1 and equal to or lower than 2, and Ar is naphthalene, in view of providing better compatibility with other resins.

The content of the aforementioned (e) novolac based epoxy resin having condensed aromatic hydrocarbon structure may be preferably equal to or higher than 20% wt. and equal to or lower than 80% wt. of the resin composition except the (g) inorganic filler, and more preferably equal to or higher than 30% wt. and equal to or lower than 50% wt., though is not particularly limited thereto. The content of lower than the above-described lower limit may cause deterioration of the adhesiveness of the insulating resin layer or deterioration of the mechanical strength. On the other hand, the content of higher than the above-described upper limit may cause deterioration of the thermal resistance or deterioration of the reliability of the obtained product.

Since the (f) phenoxy resin having bisphenol acetophenone structure represented by the general formula (1) as described above has a bulky structure, the resin has enhanced solubility to solvents and enhanced compatibility with thermosetting resins blended thereto. In addition, a uniform rough surface with lower roughness can be formed. It is preferable in formula (1) that $R_1$ is hydrogen or methyl group, $R_2$ is hydrogen or methyl group, $R_3$ is hydrogen or methyl group, and m is equal to or larger than 1 and equal to or smaller than 2, in view of the compatibility and the thermal resistance.

The aforementioned (f) phenoxy resin can be synthesized with a known method, which typically includes a method for increasing the molecular weights of the epoxy resin and the phenolic resin with a catalyst.

Examples of the aforementioned epoxy resin typically include, for example: bisphenol based epoxy resins such as bisphenol A based epoxy resin, bisphenol F based epoxy resin, bisphenol S based epoxy resin, bisphenol E based epoxy resin, bisphenol M based epoxy resin, bisphenol P based epoxy resin, bisphenol Z based epoxy resin and the like; novolac based epoxy resins such as phenol novolac based epoxy resin, cresol novolac epoxy resin and the like; epoxy resins such as biphenyl based epoxy resin, biphenyl aralkyl based epoxy resin, aryl alkylene based epoxy resin, naphthalene based epoxy resin, anthracene based epoxy resin, phenoxy based epoxy resin, dicyclopenta diene based epoxy resin, norbornene based epoxy resin, adamantane epoxy resin, fluorene based epoxy resin and the like, though is not particularly limited thereto. One type in these resins may be employed alone. Alternatively, two or more of these resins may also be employed together.

Examples of the aforementioned phenolic resins typically include, for example: novolac based phenolic resins such as phenolic novolac resin, creosol novolac resin, bisphenol A novolac resin, aryl alkylene based novolac resin and the like; resol based phenolic resins such as unmodified resol phenolic resin, or oil-modified resol phenolic resin, which is modified with tung oil, flaxseed oil, walnut oil or the like, though is not particularly limited thereto. One of these resins may be employed alone, or two or more of these resins having different weight-average molecular weights may also be employed together, or a combination of one, two or more of the aforementioned resins and a prepolymer thereof may also be employed together. Among these, aryl alkylene based phenolic resin is particularly preferable. This allows providing further improved thermal resistance of moisture-absorbed solder.

The type of the aforementioned catalyst is not particularly limited, provided that the catalyst is a compound having a catalyst capability for accelerating a reaction with alcoholic hydroxyl group and/or carboxylic group, which are created by a reaction of an epoxy resin with a phenolic resin or a reaction of epoxy group with phenolic hydroxyl group. Examples of the aforementioned catalyst include, for example, alkali metal compounds, organophosphorus compounds, tertiary amines, quaternary ammonium salts, cyclic amines, imidazoles and the like. Examples of alkali metal compounds include for example: alkali metal hydroxides such as sodium hydroxide, lithium hydroxide, potassium hydroxide and the like; alkali metal salts such as sodium carbonate, sodium bicarbonate, sodium chloride, lithium chloride, potassium chloride and the like; alkali metal alkoxides such as sodium methoxide, sodium ethoxide and the like; alkali metal phenoxide; sodium hydride; lithium hydride and the like; and alkali metal salts of organic acid such as sodium acetate, sodium stearate and the like.

Different types of these catalysts may be employed together. Ordinarily, the used amount of the catalyst is equal to or higher than 0.001% wt. and equal to or lower than 1% wt. over the reaction solid content. Since the use of the alkali metal compound as the catalyst causes the alkali metal content to be remained in the phenoxy resin to deteriorate the insulating characteristics of the printed board that uses the catalyst, the sum total of the contents of lithium (Li), sodium (Na) and potassium (K) in the phenoxy resin may be preferably equal to or lower than 5 ppm, more preferably equal to or lower than 4 ppm, and further preferably equal to or lower than 3 ppm. The total contents of equal to or higher than 5 ppm is not preferable, since this provides deteriorated insulating characteristics. On the other hand, the use of the organophosphorus compound as the catalyst also causes a catalyst residue remaining in the phenoxy resin to deteriorate the insulating characteristics of the printed board, and thus the content of phosphorus in the phenoxy resin is preferably equal to or lower than 150 ppm, and more preferably equal to or lower than 140 ppm, and further preferably equal to or lower than 100 ppm. The content of higher than 150 ppm is not preferable, since this provides deteriorated insulating characteristics.

Other structures except bisphenol acetophenone structure of general formula (1) may be contained in the aforementioned (f) phenoxy resin, and structures of bisphenol A type, bisphenol F type, bisphenol S type, biphenyl type, phenol novolac type, cresol novolac type or the like may be included, though is not particularly limited thereto. Among these, the resin having biphenyl type structure is preferable, due to its higher glass transition temperature.

The content of bisphenol acetophenone structure of general formula (1) in the aforementioned (f) phenoxy resin may be preferably equal to or higher than 5 mol % and equal to or lower than 95 mol %, more preferably equal to or higher than 10% mol and equal to or lower than 85% mol, and further preferably equal to or higher than 15% mol and equal to or lower than 75% mol, though is not particularly limited thereto. The content of lower than the above-described lower limit may be possibly fail to obtain the advantageous effects for providing improved thermal resistance and moistureproof reliability. The content of higher than the upper limit is not preferable, due to reduced solubility in a solvent.

The weight-average molecular weight of the aforementioned (f) phenoxy resin may be preferably equal to or higher than $5.0×10^3$ and equal to or lower than $1.0×10^5$, further preferably equal to or higher than $1.0×10^4$ and equal to or lower than $7.0×10^4$, and most preferably equal to or higher than $2.0×10^4$ and equal to or lower than $5.0×10^4$, though is not particularly limited thereto. The weight-average molecular weight of equal to or higher than the upper limit is not preferable, since the compatibility with other resin and the solubility to a solvent are considerably deteriorated. On the other hand, the molecular weight of equal to or lower than the lower limit may provide deteriorated film-forming ability.

The content of the aforementioned (f) phenoxy resin may be preferably equal to or higher than 5% wt. and equal to or lower than 40% wt. of the resin composition except the (g) filler, and more preferably equal to or higher than 10% wt. and equal to or lower than 20% wt., though is not particularly limited thereto. The content of lower than the above-described lower limit may cause deterioration of the mechanical strength of the insulating resin layer. On the other hand, the content of higher than the above-described upper limit may lead to increased coefficient of thermal expansion of the insulating resin layer to reduce the thermal resistance.

The same filler as the above-described (c) inorganic filler can be employed for the aforementioned (g) inorganic filler, though it is not limited thereto. The content of the aforementioned (g) inorganic filler may be preferably equal to or higher than 20 parts by weight and equal to or lower than 250 parts by weight over 100 parts by weight of the resin composition except the (g) inorganic filler, though is not particularly limited thereto. It is more preferable to be equal to or higher than 50 parts by weight and equal to or lower than 150 parts by weight to exhibit advantageous effects for providing reduced thermal expansion, improved formability and reduced water absorption.

In addition, the aforementioned resin composition may preferably further contain a thermoplastic resin. This allows providing improvement in the mechanical strength and improvement in the moisture resistance reliability of the obtained insulating resin layer.

Typical examples of the aforementioned thermoplastic resin include: thermoplastic resins such as polyimide resin, polyamideimide resin, polyphenyleneoxide resin, polyethersulfone resin, polyester resin, polyethylene resin, polystyrene resin and the like; polystyrene based thermoplastic elastomers such as styrene-butadiene copolymer, styrene-isoprene copolymer and the like; polyolefin based thermoplastic elastomers; thermoplastic elastomers such as polyamide based elastomer, polyester based elastomer and the like; diene based elastomers such as polybutadiene, epoxy-modified polybutadiene, acryl-modified polybutadiene, and methacryl-modified polybutadiene and the like, though is not particularly limited thereto. One of these may be employed alone, or two or more of these resins having different weight-average molecular weights may also be employed together, or a combination of one, two or more of the resins and a prepolymer thereof may also be employed together. Among these, phenoxy resin is preferable. This allows providing improved plating adhesiveness and mechanical strength.

The aforementioned resin composition may contain a curing agent or a curing accelerator as required.

(Resin Layer 3 Containing Compound Having Flux Function)

Figure 5:
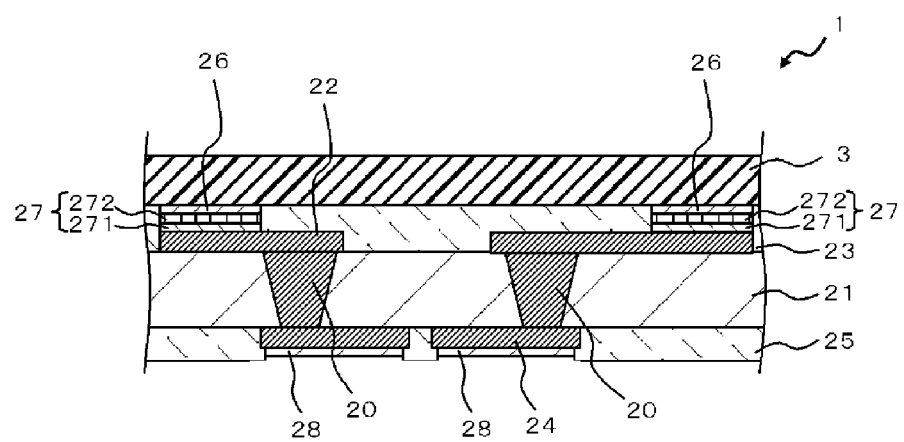
FIG. 5 is a cross-sectional view, illustrating process steps for producing the circuit board.

As shown in FIG. 5, a resin layer 3 containing a compound having flux function may be formed on the solder layer 26 so as to cover the second insulating layer 23. The resin layer 3 containing the compound having flux function may preferably exhibit a post cure-elastic modulus at a room temperature of equal to or higher than 0.5 GPa and equal to or lower than 15 GPa. In addition to above, the elastic modulus is determined by the following method. A film-form specimen of 4 mm wide×45 mm long×0.1 mm thick is prepared by curing at 180 degrees C. for 1 hour, and then a dynamic mechanical analyzer (DMA) is employed to conduct a measurement in tensile mode under the conditions of frequency of 10 Hz, temperature ramp rate of 3 degrees C./minute and the temperature range of equal to or higher than 0 degree C. and equal to or lower than 300 degrees C., and then the elastic modulus at 25 degrees C. is calculated. The resin layer 3 containing the compound having flux function may preferably contain: a phenol based novolac resin (h) containing mononuclear, dinuclear and trinuclear components at a combined contents of equal to or higher than 30% and equal to or smaller than 70%; an epoxy resin (i) that is liquid at 25 degrees C.; a compound (j) having flux function; and a film-forming resin (k).

Typical examples of the aforementioned phenolic novolac resin (h) include phenol novolac resins, cresol novolac resins, bisphenol A based novolac resins, bisphenol F based novolac resins, bisphenol AF based novolac resins and the like. Among these, phenol novolac resins and cresol novolac resins are preferable, since these can effectively increase the glass transition temperature of the cured product of the adhesive film and can reduce the quantity of the phenolic novolac resins that generate the outgas. While the content of the aforementioned phenolic novolac resin is not particularly limited to any specific content, it is preferably contained in the resin layer 3 at equal to or higher than 3% wt. and equal to or lower than 30% wt., and is particularly preferably contained at equal to or higher than 5% wt. and equal to or lower than 25% wt. The content of the aforementioned phenolic novolac resin within the above-described range allows effectively achieve an effective increase of the glass transition temperature of the cured resin layer 3 and an effective reduction of the quantity of the phenol based novolac resin that generates the outgas. When the combined contents of the mononuclear, the binuclear and the trinuclear components is lower than 30% (the combined contents of components of four or more of phenolic nuclei is higher than 70%), the reactivity with the epoxy resin that is liquid at 25 degrees C. is reduced and unreacted phenolic novolac resin is remained in the cured product of the resin layer 3, such that problems of brittleness of the resin layer 3 and decreased workability are generated. On the other hand, when the combined contents of the mononuclear, the binuclear and the trinuclear components is higher than 70% (the combined contents of components of four or more of phenolic nuclei is lower than 30%), the quantity of the outgas generating during the cure of the resin layer 3 may be increased. Further, the tackiness of the resin layer 3 may be excessively increased. Total contents of the binuclear component and the trinuclear component in the aforementioned phenol based novolac resin is not particularly limited to any specific content, but is preferably equal to or higher than 30% and equal to or lower than 70%. The content of equal to or higher than the above-described lower limit provides inhibiting the increase of the quantity of the outgas during the sure of the resin layer 3. On the other hand, the content of equal to or lower than the above-described upper limit more effectively ensures the flexibility and the bendability of resin layer 3. The content of the mononuclear component in the aforementioned phenol based novolac resin (h) is not particularly limited to any specific content, but is preferably equal to or lower than 1% in the resin layer 3, and particularly preferably equal to or lower than 0.8%. The content of the aforementioned mononuclear component within the above-described range allows reducing the quantity of the outgas during the cure of the resin layer 3. The weight-average molecular weight of the aforementioned phenol based novolac resin (h) is not particularly limited to any specific content, but is preferably equal to or larger than 300 and equal to or smaller than 1,500, and particularly preferably equal to or larger than 400 and equal to or smaller than 1,400. The content of equal to or higher than the above-described lower limit allows reducing the quantity of the outgas during the cure of the resin layer 3. On the other hand, the content of equal to or lower than the above-described upper limit more effectively ensures the flexibility and the bendability of resin layer 3.

It is preferable that the resin layer 3 containing the compound having flux function contains the epoxy resin (i) that is liquid at 25 degrees C. This allows providing the flexibility and the bendability to the resin layer 3. While the type of the epoxy resin (i) that is liquid at 25 degrees C. is not particularly limited to any specific type, typical examples include bisphenol A based epoxy resins, bisphenol F based epoxy resins, glycidyl amine based epoxy resins, glycidyl ester based epoxy resins and the like. Among these, bisphenol A based epoxy resins and bisphenol F based epoxy resins are preferable, since these exhibit better adhesiveness of the adhesive film to the support and the adhesion object and further better mechanical characteristics of the cured adhesive film.

Further, the aforementioned epoxy resin (i) that is liquid at 25 degrees C. may more preferably exhibit a viscosity at 25 degrees C. of equal to or higher than 500 mPa·s and equal to or lower than 50,000 mPa·s, and more preferably equal to or higher than 800 mPa·s and equal to or lower than 40,000 mPa·s. The viscosity at 25 degrees C. of equal to or higher than the above-described lower limit allows ensuring the flexibility and the bendability of the resin layer 3. The viscosity at 25 degrees C. of equal to or lower than the above-described upper limit also allows providing increased tackiness of the resin layer 3, so that decrease in the handling ability can be prevented.

The content of the aforementioned the epoxy resin (i) that is liquid at 25 degrees C. is preferably equal to or larger than 10% wt. and equal to or smaller than 80% wt., and more preferably equal to or larger than 15% wt. and equal to or smaller than 75% wt., though is not particularly limited thereto. The content of equal to or higher than the above-described lower limit allows ensuring the flexibility and the bendability of the resin layer 3. On the other hand, the content of equal to or lower than the above-described upper limit also allows providing increased tackiness of the resin layer 3, so that a decrease in the handling ability can be more effectively prevented.

While the type of the compound (j) having flux function is not particularly limited provided that it functions to remove an oxide film on the solder surface, a compound having any one of carboxylic group and phenolic hydroxyl group, or a compound having both of carboxylic group and phenolic hydroxyl group may be preferable.

The compounding ratio of the compound (j) having flux function may be preferably equal to or higher than 1% wt. and equal to or lower than 30% wt., and more preferably equal to or higher than 3% wt. and equal to or lower than 20% wt. The compounding ratio of the compound having flux function of within the above-described range allows improving the flux activity. In addition, remaining of the unreacted compound in the cure of the resin layer 3 can be prevented to provide improved anti-migration property.

Further, the compounds serving as the curing agents for the epoxy resin include compounds having flux function (hereinafter such compound is also referred to as flux-activating curing agent). For example, aliphatic dicarboxylic acid, aromatic dicarboxylic acid and the like, which serve as curing agents for epoxy resins, also exhibit the flux effects. The flux-activating curing agent serving as the flux and also serving as the curing agent for the epoxy resin as described above may preferably be employed.

Here, the compound having flux function and including carboxylic group is a compound having one or more of carboxylic group(s) in a molecule, and may be in liquid state or may be in a solid state. The compound having flux function and including phenolic hydroxyl group is a compound having one or more of phenolic hydroxyl group(s) in a molecule, and may be in liquid state or may be in a solid state. Further, the compound having flux function and including carboxylic group and phenolic hydroxyl group is a compound having one or more of carboxylic group(s) and one or more of phenolic hydroxyl group(s) in a molecule, and may be in liquid state or may be in a solid state.

Among these, typical examples of the compound having flux function and having carboxylic group include aliphatic acid anhydrides, alicyclic acid anhydrides, aromatic acid anhydrides, aliphatic carboxylic acids, aromatic carboxylic acids and the like.

Examples of the aliphatic acid anhydrides related to the compound having flux function and including carboxylic group include succinic anhydride, polyadipicacid anhydride, polyazelaicacid anhydride, polysebacicacid anhydride and the like.

Examples of the alicyclic acid anhydrides related to the compound having flux function and including carboxylic group include methyl tetrahydro phthalic anhydride, methyl hexahydro phthalic anhydride, anhydrous methyl humic acid, hexahydro phthalic anhydride, tetrahydro phthalic anhydride, trialkyl tetrahydro phthalic anhydride, methylcyclohexene dicarboxylic acid anhydride and the like.

Examples of the aromatic acid anhydrides related to the compound having flux function and including carboxylic group include phthalic anhydride, trimellitic anhydride, pyromellitic dianhydride, benzophenone tetracarboxylic acid anhydride, ethylene glycol bis trimelitate, glycerol tris trimelitate and the like.

Examples of the aliphatic carboxylic acids related to the compound having flux function and including carboxylic group include compounds represented by the following general formula (II), formic acid, acetic acid, propionic acid, butanoic acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, mutanedioic acid and the like.

$$HOOC\text{---}(CH_2)_n\text{---}COOH \quad (II)$$

(in formula (II), n represents an integer of 1 to 20)

Examples of the aromatic carboxylic acid related to the compound having flux function and including carboxylic group include benzoic acid, phthalic acid, isophthalic acid, terephthalic acid, hemimellitic acid, trimellitic acid, trimesic acid, mellophanic acid, prehnitic acid, pyromellitic acid, mellitic acid, toluic acid, xylic acid, hemellitic acid, mesitylenic acid, prehnitylic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid, 3,5-dihydroxy-2-naphthoic acid and the like, phenolphthalin, diphenolic acid and the like.

Among these compounds having flux function and including carboxylic group, the compound represented by the aforementioned general formula (II) is preferable, because such compound provides well balanced characteristics among the activity of the compound having flux function, a quantity of generated outgas in the cure of the resin layer 3, and the elastic modulus and the glass transition temperature of the cured resin layer 3. Among the compounds represented by the aforementioned general formula (1), the compounds represented by formula (II), in which n is 3 to 10, are particularly preferable, since these compounds provide inhibition to an increase in the elastic modulus of the cured resin layer 3 and provide improvement in the adhesiveness.

Among the compounds represented by the aforementioned general formula (II), typical examples of the compounds represented by formula (II), in which n is 3 to 10, include, for example: glutaric acid where n=3 (HOOC—$(CH_2)_3$—COOH); adipic acid where n=4 (HOOC—$(CH_2)_4$—COOH); pimelic acid where n=5 (HOOC—$(CH_2)_5$—COOH); sebacic acid where n=8 (HOOC—$(CH_2)_8$—COOH); and n=10 (HOOC—$(CH_2)_{10}$—COOH) and the like.

Typical examples of the aforementioned compound having flux function and having phenolic hydroxyl group includes phenols, and more specifically include, for example, monomers containing phenolic hydroxyl group such as phenol, o-cresol, 2,6-xylenol, p-cresol, m-cresol, o-ethylphenol, 2,4-xylenol, 2,5-xylenol, m-ethylphenol, 2,3-xylenol, mesitol, 3,5-xylenol, p-tertiary butylphenol, catechol, p-tertiary amyl phenol, resorcinol, p-octylphenol, p-phenylphenol, bisphenol A, bisphenol F, bisphenol AF, biphenol, diallyl bisphenol F, diallyl bisphenol A, trisphenol, tetrakisphenol and the like.

The compound having one of carboxylic group and phenolic hydroxyl group, or the compound having both of carboxylic group and phenolic hydroxyl group, as described above, is capable of reacting with the epoxy resin to be three-dimensionally incorporated therein.

Therefore, in view of providing improved creation of three dimensional network in the cured epoxy resin, a flux-activating curing agent, which has flux effect and serves as a curing agent for an epoxy resin, is preferable for the compound having flux function. Typical flux-activating curing agent includes, for example, a compound having two or more of phenolic hydroxyl group which can be added to the epoxy resin and one or more of carboxylic group which is direct bound to aromatic group that exhibits the flux effect (reduction effect) in a single molecule. Typical examples of such flux-activating curing agent include: benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, gallic acid (3,4,5-trihydroxybenzoic acid) and the like; naphthoic acid derivatives such as 1,4-dihydroxy-2-naphthoic acid, 3,5-dihydroxy-2-naphthoic acid, 3,7-dihydroxy-2-naphthoic acid and the like; phenolphthalin; and diphenolic acid and the like, and one of these may be employed alone, or combination of two or more may also be employed. Among these, 2,3-dihydroxybenzoic acid, gentisic acid and phenolphthalin are preferable, because of enhanced effect for removing an oxide film from the solder surface and enhanced reactivity with the epoxy resin.

Further, the compounding ratio of the flux-activating curing agent in the resin layer 3 may be preferably equal to or higher than 1% wt. and equal to or higher than 30% wt., and particularly preferably equal to or higher than 3% wt. and equal to or lower than 20% wt. The compounding ratio of the flux-activating curing agent in the resin layer 3 within the above-described range allows improving the flux activity of the resin layer 3. In addition, residue of the flux-activating curing agent unreacted with the epoxy resin in the resin layer 3 can be prevented.

The resin layer 3 may preferably contain the film-forming resin (k) in order to improve the film-formability. This allows easily processing into a film state. Further, this provides better mechanical characteristics.

Examples of the aforementioned film-forming resin (k) include (meta) acrylic based resins, phenoxy resins, polyester resins, polyurethane resins, polyimide resins, siloxane-modified polyimide resins, polybutadiene, polypropylene, styrene-butadiene-styrene copolymers, styrene-ethylene-butylene-styrene copolymers, polyacetal resins, polyvinylbutyral resins, polyvinylacetal resins, isobutylene-isoprene rubbers, chloroprene rubbers, polyamide resins, acrylonitrile-butadiene copolymers, acrylonitrile-butadiene-acrylate copolymers, acrylonitrile-butadiene-styrene copolymers, polyvinyl acetate, nylon and the like, though is not particularly limited thereto.

One of these may be employed alone, or combination of two or more may also be employed together. Among these, at least one selected from a group consisting of (meta) acrylic based resins, phenoxy resins and polyimide resins is preferable.

The content of the aforementioned film-forming resin (k) may be preferably equal to or larger than 10% wt. and equal to or smaller than 50% wt. in the aforementioned resin layer 3, and more preferably equal to or larger than 15% wt. and equal to or smaller than 40% wt., and most preferably equal to or larger than 20% wt. and equal to or smaller than 35% wt., though is not particularly limited thereto. The content within the aforementioned range allows inhibiting the flowability of the resin layer 3, allowing easier handling of the resin layer 3.

Further, the aforementioned resin layer 3 may further contain a curing accelerator and/or a silane coupling agent.

Figure 2:
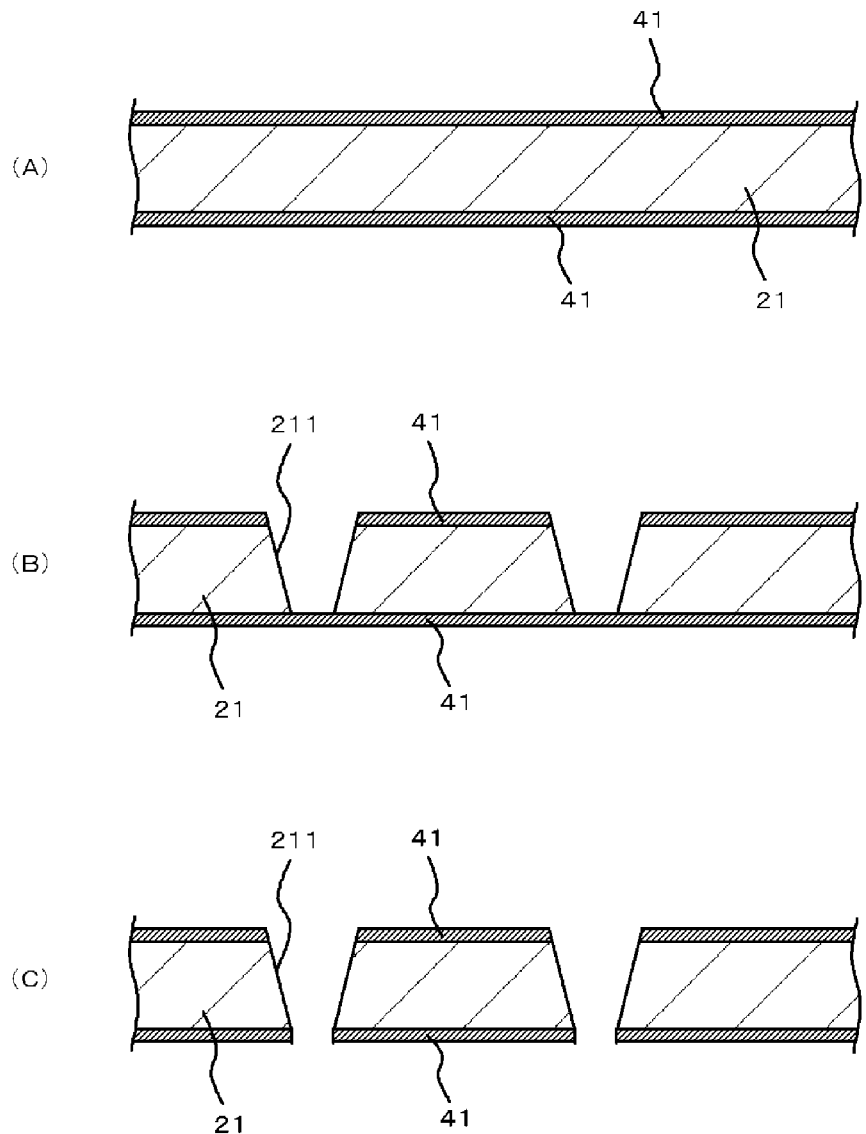
FIG. 2 includes cross-sectional views, illustrating process steps for producing the circuit board.

The above-described circuit board 1 may be produced as follows. As shown in FIG. 2 (A), in the beginning, a first insulating layer 21 on whose front and back surfaces metallic films 41 (for example, copper films) formed is prepared. Next, as shown in FIG. 2 (B), holes 211 extending through one of the metallic films 41 and the first insulating layer 21 are formed. The holes extending through one of the metallic films 41 may be created by an etching process, and then, the holes extending through the first insulating layer 21 may be created with a laser.

Figure 3:
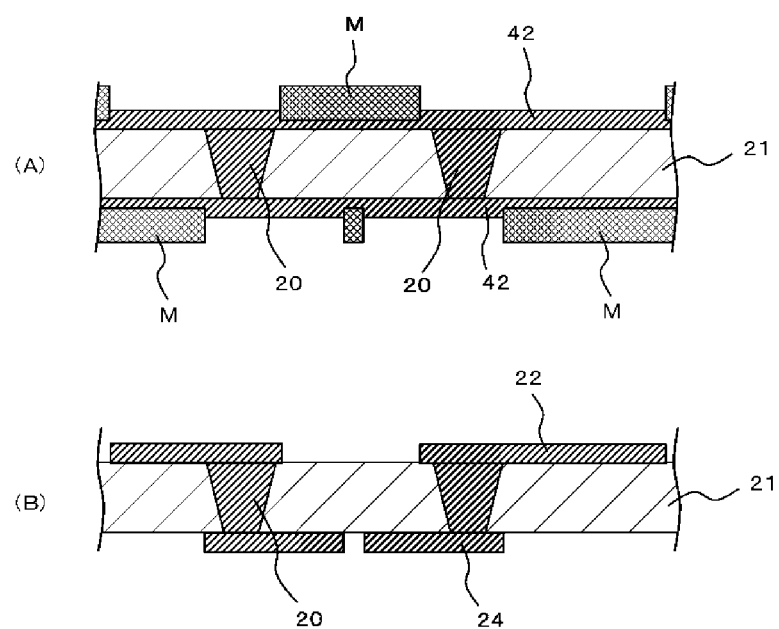
FIG. 3 includes cross-sectional views, illustrating process steps for producing the circuit board.
Figure 4:
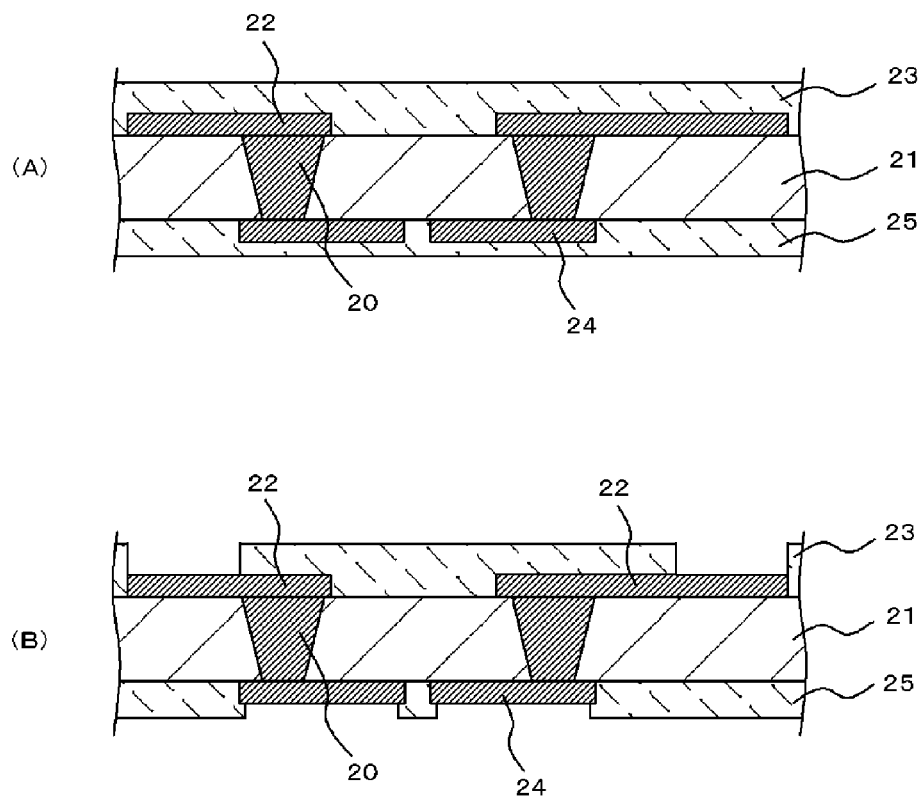
FIG. 4 includes cross-sectional views, illustrating process steps for producing the circuit board.

Alternatively, as shown in FIG. 2 (C), through holes 211 extending through additionally the other of the metallic films 41 may be formed. In the next, a chemical plating process is conducted over the metallic films 41 and in the inside of the holes 211 of the first insulating layer 21. Then, as shown in FIG. 3 (A), masks M are disposed, and then the inside of the holes 211 are filled and a plating is conducted over the metallic films 41. This creates electric conductors, which serves as vias 20, and also creates metallic films 42 (it is indicated that the metallic film 42 includes the metallic film 41 and a plated film on the metallic film 41). Next, the sections of the metallic films 42 covered with the masks M are removed by a flash etching process to form a first circuit layer 22 and a second circuit layer 24 as shown in FIG. 3 (B). Then, as shown in FIG. 4 (A), a sheet-like second insulating layer 23 is adhered onto the first circuit layer 22. At this time, a second insulating layer 23 and a third insulating layer 25 may be simultaneously adhered. Then, the sheet-like second insulating layer 23 and the sheet-like third insulating layer 25 are heated to be cured. Next, as shown in FIG. 4 (B), apertures are formed in the second insulating layer 23 and the third insulating layer 25, respectively. The second insulating layer 23 may be irradiated with, for example, ultraviolet (UV) laser, and the third insulating layer 25 may be irradiated with carbon dioxide laser to form apertures. Then, as shown in FIG. 1, metallic layers 27 and solder layers 26 are formed in the apertures of the second insulating layer 23, and metallic layers 28 are formed in the apertures of the third insulating layer 25. As described above, the condition shown in FIG. 1 can be commercial conformations. Further, as shown in FIG. 5, the resin layer 3 containing the compound having flux function may be compressively bound onto the second insulating layer 23. The circuit board 1 is completed by the above-described processes.

In the next, the process for producing a semiconductor device employing the circuit board 1 of FIG. 5 will be described.

(Positioning and Provisional Adhesion)

Figure 6:
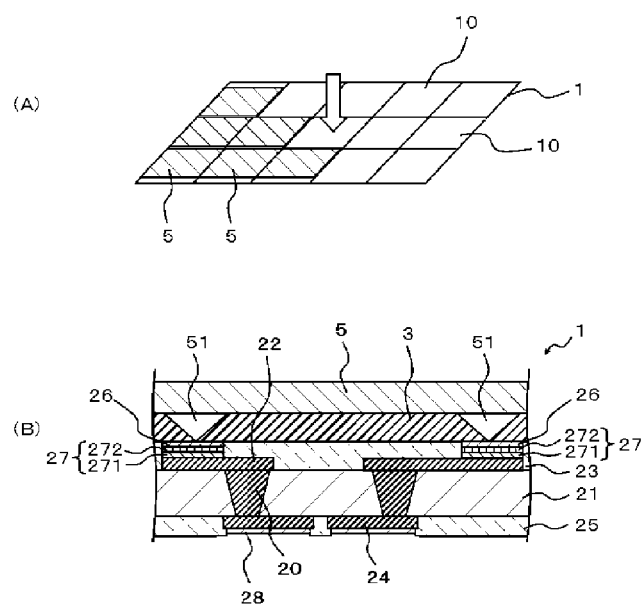
FIG. 6 includes schematic diagrams, illustrating process steps for installing semiconductor chips on the circuit board.

As shown in FIG. 6, a plurality of semiconductor chips 5 are mounted on the circuit board 1. The semiconductor chips 5 are arranged along the surface direction of the circuit board 1. Electrodes 51 of the semiconductor chips 5 extend through the resin layer 3 containing the compound having flux function to be in contact with the solder layers 26. While the conditions are not particularly limited, the position of the electrodes 51 and the positions of the solder layer 26 are aligned and then these are provisionally adhered together at a temperature of equal to or higher than 25 degrees C. and equal to or lower than 175 degrees C. and with a load per single semiconductor chip 5 of equal to or larger than 0.5 kgf and equal to or smaller than 5 kgf.

(Junction)

Then, the multiple-layered member composed of the circuit board 1 and the plurality of semiconductor chips 5 is heated to create solder junctions of the electrodes 51 and the solder layers 26. While the process conditions are not particularly limited, the process may be preferably conducted at a temperature of equal to or higher than 200 degrees C. and lower than 300 degrees C. for the duration time of equal to or longer than 1 second and equal to or shorter than 60 minutes with a load per single semiconductor chip 5 of equal to or larger than 0.1 kgf and equal to or smaller than 15 kgf. In particular, it is preferable to conduct at a temperature of equal to or higher than 200 degrees C. and equal to or lower than 260 degrees C. and for the duration time of equal to or longer than 5 seconds and equal to or shorter than between 300 seconds. The temperature for creating the junction depends on the melting point of the solder material of the solder layer 26, and the load depends on the number of the terminals to be joined. Since the junction of the electrode 51 and the solder layer 26 is created through the resin layer 3 containing the compound having flux function in this case, the connection of the solder can be created while inhibiting an oxidization of the surface of the solder layer 26 is (while removing a surface oxide film).

(Cure)

It is preferable that such multiple-layered member is further heated to cure the resin that constitutes the resin layer 3 containing the compound having flux function. While the conditions for the heating in this case is not particularly limited, the preferable condition may be at a temperature of equal to or higher than 120 degrees C. and equal to or lower than 200 degrees C. for the duration time of equal to or longer than 30 minutes and equal to or shorter than between 180 minutes, which causes the cure of the resin layer 3 containing the compound having flux function to provide encapsulation between the electrodes 51 and the solder layers 26, thereby improving the coupling reliability. While the resin layer 3 containing the compound having flux function is cured after the multiple-layered member is obtained in the present embodiment, the process is not limited thereto, and a method of obtaining a multiple-layered member after the resin layer 3 containing the compound having flux function is cured may alternatively be employed.

(Resin Encapsulation)

An epoxy resin composition is compression-molded to the obtained multiple-layered member from the side of the semiconductor chips 5 by employing a metallic mold. Then, the product is taken out, and a cure and a drying are conducted with a drier. While the conditions for the heating processing in this occasion is not particularly limited, the preferable conditions for the compression-molding are for the thickness of equal to or larger than 30 μm and equal to or smaller than 300 μm, at a temperature of equal to or higher than 120 degrees C. and equal to or lower than 200 degrees for the duration time of equal to or longer than 1 minute to equal to or shorter than 5 minutes, and the preferable conditions for the cure are at a temperature of equal to or higher than 120 degrees C. and equal to or lower than 200 degrees for the duration time of equal to or longer than 3 hours to equal to or shorter than 5 hours, and these conditions allow providing an encapsulation for the multiple-layered member to ensure the reliability.

(Solder Ball Installation)

Further, solder balls are formed on the metallic layer 28 of the circuit board 1. This allows facilitating the secondary installation to other substrates. Typical method for providing solder balls includes, for example, a plating process, a paste printing process, and a ball installation process.

(Dicing)

Figure 7:
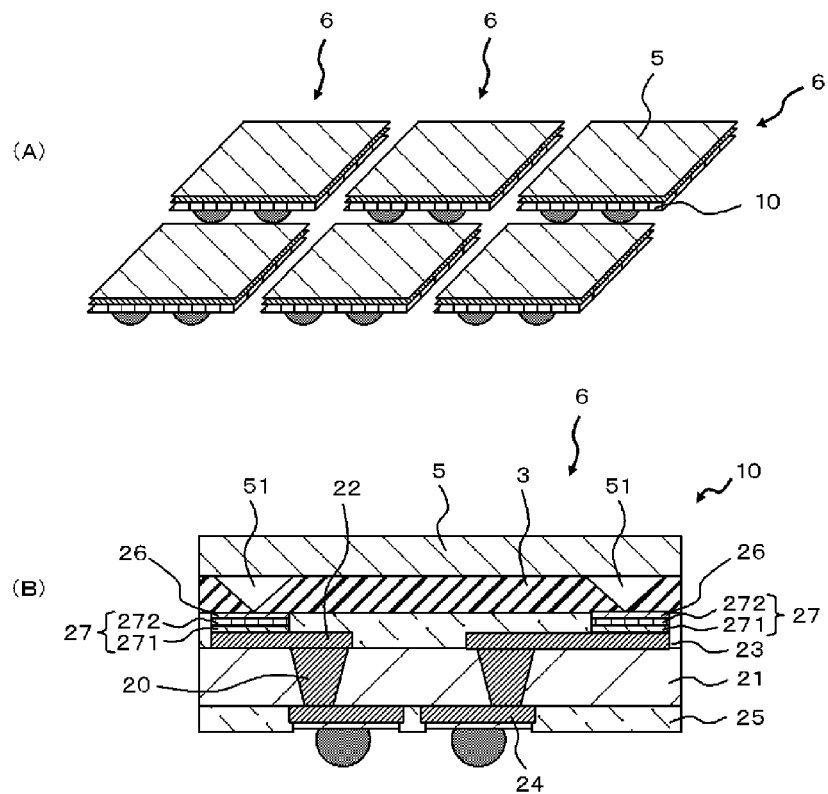
FIG. 7 includes schematic diagrams, illustrating a semiconductor device.

Next, as shown in FIG. 7 (A), the circuit board 1 is divided to obtain a plurality of semiconductor devices 6, each of which is composed of a single semiconductor chip 5 and a segmented single circuit board 1 (hereinafter, it may be often referred to as a circuit board section 10). When the segmentation is conducted, a dicing sheet is provided on the surface opposite to the side having the solder balls, and then a dicing process is conducted.

In such semiconductor device, as shown in FIG. 7 (B), the side surface of the circuit board section 10 and the side surface of the semiconductor chip 5 are coplanar, viewed from the side of the substrate surface of the circuit board section 10. This allows providing reduced external dimension of the semiconductor device 6 as possible. In addition to above, before the dicing process, it is preferable to dispose a resin layer containing the compound having flux function on the surface of the multiple-layered member in the side where the solder balls are installed. This allows easily providing the solder connection in the secondary installation, and omitting the flux processing, so that productivity, temperature cycle property and reliability after the secondary installation such as drop test results can be improved.

The dicing sheet employed here may be a commercially available sheet without modification.

Second Embodiment

Second embodiment is similar to first embodiment except that a photosensitive polymer is employed for the second insulating layer 23 and the third insulating layer 25.

The second insulating layer 23 and the third insulating layer 25 may be composed of, for example, a resin composition containing (l) photosensitive polymer as an essential constituent.

The use of such resin composition allows easy patterning of apertures in the second insulating layer 23 and the third insulating layer 25 by an exposure and a development.

The type of the aforementioned (l) photosensitive polymer is not particularly limited to any specific polymer, and it may be formed by using a known photosensitive polymer composition. The aforementioned (l) photosensitive polymer may be negative type or positive type polymer. The aforementioned (l) photosensitive polymer may contain, for example, an acryl resin and the like, and an epoxy-modified acryl resin may be typically employed. Further, in addition to the photocurable resin such as acrylic resin, a thermosetting resin such as an epoxy resin may be contained.

The aforementioned (l) photosensitive polymer may contain a polymerization initiator, a sensitizer, a leveling agent and the like. This may further contain a filler such as silica and the like. While the filler here is not particularly limited, similar materials as in the above-described (c) (g) inorganic fillers may also be employed. In such case, it is preferable to select the particle size to be smaller than the wave length of light employed in the exposure process.

Further, conformation of the liquid type or film type may be adopted to the aforementioned (l) photosensitive polymer. Considering the coating-ability over the first circuit layer 22 and the second circuit layer 24, it is preferable to employ the film type. When the liquid type is employed, the formation may be conducted by a screen printing process, a coater process or the like. Further, the circuit board 1 of the present embodiment may be dipped in a liquid resist to form the second insulating layer 23 and the third insulating layer 25 in the both sides at the same time. When the film type is employed, a formation may be conducted by employing a vacuum laminator. In case of film type, the second insulating layer 23 and the third insulating layer 25 can also be formed in the both sides at the same time.

The circuit board 1 in second embodiment is produced as follows. Here, as shown in FIG. 3 (B), the first circuit layer 22 and the second circuit layer 24 are formed similarly as in first embodiment. Then, as shown in FIG. 4 (A), a vacuum laminator is employed to achieve a simultaneous adhesions of the second insulating layer 23 of a film type photosensitive polymer on the first circuit layer 22 and of the third insulating layer 25 of the same material on the second circuit layer 24. Subsequently, a position of a photo mask is adjusted so as to obtain predetermined apertures and then an exposure is conducted. Subsequently, the substrate is dipped in a developing solution such as an alkaline water solution to conduct the development process. This allows, as shown in FIG. 4 (B), forming the apertures in the second insulating layer 23 and the third insulating layer 25. Subsequently, a heating and further an exposure to ultraviolet (UV) ray are suitably conducted according to the type of the employed photosensitive polymer to carry out the cure. Further, when the diameter of the desired aperture is smaller than the resolution of the photosensitive polymer, for example, the second insulating layer 23 may be irradiated with UV laser and the third insulating layer 25 may be irradiated with carbonic acid laser similarly as in first embodiment after the thermal cure process to create the desired apertures. Therefore, the semiconductor device 6 is obtained by the method similarly as employed in first embodiment.

The present invention is not limited to above-described two embodiments, and the modifications and the improvements within the scope of achieving the object of the present invention may also be included in the present invention. For example, while each of the second insulating layer and the third insulating layer in the two embodiments is composed of a single layer, the configuration is not limited thereto, and the second insulating layer and the third insulating layer may alternatively be composed of multiple layers. The average coefficient of thermal expansion (B) may be the average coefficient of thermal expansion of the whole second insulating layer. The average coefficient of thermal expansion (C) may be the average coefficient of thermal expansion of the whole third insulating layer.

EXAMPLES

Next, examples of the present invention will be described.

Example 1

A circuit board was produced by a similar process as employed in the above-described embodiments.

(First Insulating Layer)

The first insulating layer was manufactured as follows. 11 parts by weight (pbw) of biphenyl dimethylene based epoxy resin (commercially available from Nippon Kayaku Co., Ltd, brand name: NC3000FH) as the epoxy resin; 20 pbw of novolac based cyanate resin (commercially available from Lonza Japan Co., Ltd., Primaset PT-30); and 9.0 pbw of phenolic resin (commercially available from Meiwa Plastic Industries Ltd., brand name: MEH7851-4H) as the curing agent, were added to methyl ethyl ketone to be dissolved and dispersed. Further, 60 pbw of spherical fused silica (commercially available from Admatechs Company Limited, "SO-25R", mean particle diameter 0.5 μm) as the inorganic filler was added to the solvent, and the solvent was stirred for 10 minutes by employing a high-speed stirrer to prepare a resin varnish having a solid content of 50% wt. A glass cloth (0.1 m thick, commercially available from Nitto Boseki Co., Ltd., brand name: WEA-2116) was immersed in the above-described resin varnish, and then was dried by a heating furnace of 150 degrees C. for 2 minutes to obtain a prepreg (first insulating layer) having a varnish solid content in the prepreg of about 50% wt.

(Multiple-Layered Board)

Next, copper foils of 18 μm thick were overlaid on the front and the back surfaces of the above-described prepreg, and a heating and compression forming was conducted at a pressure of 4 MPa, at a temperature of 200 degrees C. for a duration time of 2 hours. The multiple-layered board having a thickness of 0.136 mm and being copper-cladded on both sides was obtained by the above-described process. Then, through holes were formed in the copper-cladded multiple-layered board by a $CO_2$ laser. Subsequently, the through holes of the copper-cladded multiple-layered board were filled with copper plating by an electrolytic copper plating process, and a circuit pattern formation process was conducted to form the first circuit layer and the second circuit layer.

(Second Insulating Layer and Third Insulating Layer)

In the beginning, a synthesis of a phenoxy resin employed for the second insulating layer and the third insulating layer will be described.

[Synthesis of Phenoxy Resin A Containing Bisphenol Acetophenone Structure]

100 grams (g) of tetramethyl biphenyl based epoxy resin (commercially available from Japan Epoxy Resin Co., Ltd., "YX-4000", epoxy equivalent 185 g/eq), 80 g of bisphenol acetophenone, and 70 g of cyclohexanone were added in a reaction chamber of a capacity of 1 liter, and was stirred to be dissolved. Next, 0.4 g of 50% wt. tetramethylammonium chloride solution was dropped, and a reaction was carried out in the nitrogen atmosphere for 5 hours at 180 degrees C. After the reaction was completed, the precipitates were filtered out, and a vacuum drying process was conducted in a vacuum dryer for 8 hours at 95 degrees C. to obtain the phenoxy resin A having bisphenol acetophenone structure represented by the formula (A) having weight-average molecular weight of 38,000 and glass transition temperature of 130 degrees C.

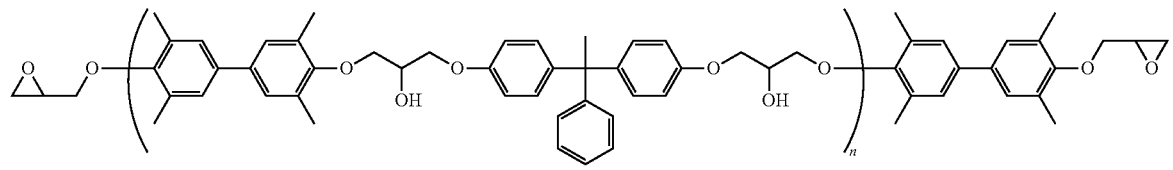

(A)

Next, 18 pbw of cyanate A (novolac based, commercially available from Lonza Japan Co., Ltd., "Primaset PT-30") as the polyfunctional cyanate resin; 30 pbw of epoxy A (novolac based having naphthalene structure, commercially available from DIC Co., Ltd., "HP-5000", epoxy equivalent 250 g/eq) as the novolac based epoxy resin having condensed aromatic hydrocarbon structure; 20 pbw of phenoxy resin A having bisphenol acetophenone structure; 40 pbw of inorganic filler A (spherical silica, commercially available from Admatechs Company Limited, "SO-25R", mean particle diameter 0.5 µm); 0.3 pbw of a curing accelerator (imidazole compound, commercially available from Shikoku Chemicals Corporation, "Curezol 1B2PZ"); and 1 pbw of a coupling agent (epoxysilane, commercially available from Shin-Etsu Chemical Co., Ltd., "KBM-403E") were added to methyl ethyl ketone and cyclohexanone to be mixed and dissolved therein. Subsequently, the solvent was stirred for 60 minutes by employing a high-speed stirrer to prepare a resin varnish having a solid content of 60% wt. In addition to above, the rate of the inorganic filler in the resin composition was about 41% wt.

The resin varnish obtained as described above was applied onto a polyethylene terephthalate (hereinafter referred to as PET) film by employing a comma bar coater so as to obtain a thickness of the dried insulating resin layer of 40 µm, and the sheet was dried with a drying equipment of 150 degrees C. for 5 minutes to produce a resin sheet (second insulating layer and third insulating layer).

(Resin Layer Containing Compound Having Flux Function)

15.0 pbw of phenol novolac resin (commercially available from Sumitomo Bakelite Co., Ltd., PR 55617); 45.0 pbw of liquid bisphenol A based epoxy resin (commercially available from DIC Co., Ltd., EPICLON-840S); 15.0 pbw of phenolphthalin serving as a flux activator compound (commercially available from Tokyo Chemical Industry Co., Ltd.); 24.4 pbw of bisphenol A based phenoxy resin (commercially available from Tohto Kasei Co., Ltd., YP-50) as the film-forming resin; 0.1 pbw of 2-phenyl-4-methyl imidazole (commercially available from Shikoku Chemicals Co., Ltd., 2P4MZ) as the curing accelerator; and 0.5 pbw of β-(3,4 epoxy cyclohexyl) ethyl trimethoxysilane (commercially available from Shin-Etsu Chemical Co., Ltd., KBM-303) as the silane coupling agent, were dissolved in methylethyl ketone to prepare a resin varnish having the resin concentration of 50%. The obtained resin varnish was applied over a base polyester film (commercially available from Toray Industries, Inc., Lumirror) so as to obtain a thickness of 50 µm, and then was dried at 100 degrees C. for 5 minutes. An adhesive film having flux activity of 25 µm thick was obtained by the above process.

(Circuit Board)

The second insulating layer was laminated on the side of the first circuit layer, and the third insulating layer was laminated on the side of the second circuit layer, by employing a vacuum laminator and then were cured. Then, apertures were formed in the second insulating layer with a UV laser, and plating processes with copper, nickel, and solder were conducted. Further, apertures were formed in the third insulating layer by $CO_2$ laser, and then plating processes with nickel and gold were conducted.

Then, a resin layer containing the compound having flux function was laminated with a vacuum laminator.

Example 2

A first insulating layer similarly as employed in Example 1 was employed to obtain a multiple-layered board.

(Second Insulating Layer and Third Insulating Layer)

A synthesis of the phenoxy resin employed for the second insulating layer and the third insulating layer will be described.

[Synthesis of Phenoxy Resin B Containing Bisphenol Acetophenone Structure]

100 g of bisphenol A based epoxy resin (commercially available from Japan Epoxy Resin Co., Ltd., "jER828", epoxy equivalent 186 g/eq), 70 g of bisphenol acetophenone, and 70 g of cyclohexanone were added in a reaction chamber of a capacity of 1 liter, and was stirred to be dissolved. Next, 0.4 g of 50% wt. tetramethylammonium chloride solution was dropped, and a reaction was carried out in the nitrogen atmosphere for 5 hours at 180 degrees C. After the reaction was completed, the precipitates were filtered out, and a vacuum drying process was conducted in a vacuum dryer for 8 hours at 95 degrees C. The phenoxy resin B having bisphenol acetophenone structure represented by the formula (B) having weight-average molecular weight of 46,000 and glass transition temperature of 110 degrees C. was obtained by this process.

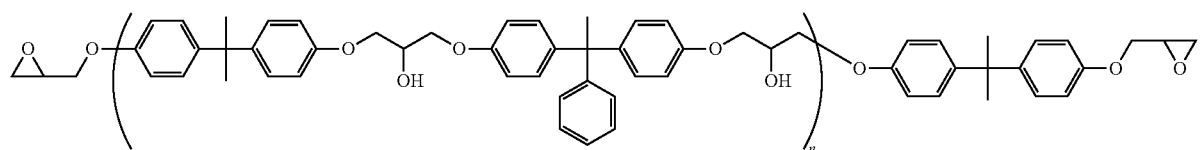

(B)

26 pbw of cyanate B (bis A based prepolymer, commercially available from Lonza Japan Co., Ltd., "Primaset BA230") as the polyfunctional cyanate resin; 26 pbw of epoxy B (novolac based having naphthalene structure, commercially available from DIC Co., Ltd., "EXA-9900", epoxy equivalent 270 g/eq) as the novolac based epoxy resin having condensed aromatic hydrocarbon structure; 8 pbw of phenoxy resin C having bisphenol acetophenone structure; 40 pbw of inorganic filler A (spherical silica, commercially available from Admatechs Company Limited, "SO-25R", mean particle diameter 0.5 μm); 0.3 pbw of curing accelerator (imidazole compound, commercially available from Shikoku Chemicals Corporation, "Curezol 1B2PZ"); and 1 pbw of coupling agent (epoxysilane, commercially available from Shin-Etsu Chemical Co., Ltd., "KBM-403E") were added to methyl ethyl ketone and cyclohexanone to be mixed and dissolved therein. Subsequently, the mixture was stirred for 60 minutes by employing a high-speed stirrer to prepare a resin varnish having a solid content of 60% wt.

In addition to above, the rate of the inorganic filler in the resin composition was about 41% wt. This resin varnish was employed to produce the second insulating layer and the third insulating layer similarly as in Example 1. Then, a circuit board was obtained similarly as in Example 1

Example 3

The first insulating layer was manufactured as follows. 17 parts by weight (pbw) of biphenyl dimethylene based epoxy resin (commercially available from Nippon Kayaku Co., Ltd, brand name: NC3000FH) as the epoxy resin; 30 pbw of novolac based cyanate resin (commercially available from Lonza Japan Co., Ltd., Primaset PT-30); and 13 pbw of phenolic resin (commercially available from Meiwa Plastic Industries Ltd., brand name: MEH7851-4H) as the curing agent, were added to methyl ethyl ketone to be dissolved and dispersed. Further, 40 pbw of spherical fused silica (commercially available from Admatechs Company Limited, "SO-25R", mean particle diameter 0.5 μm) as the inorganic filler was added to the solvent, and the mixture was stirred for 10 minutes by employing a high-speed stirrer to prepare a resin varnish having a solid content of 50% wt. A glass cloth (0.1 m thick, commercially available from Nitto Boseki Co., Ltd., brand name: WEA-2116) was immersed in the above-described resin varnish, and then was dried by a heating furnace of 150 degrees C. for 2 minutes. A prepreg (first insulating layer) having a varnish solid content in the prepreg of about 50% wt. was obtained by this process.

(Multiple-Layered Board)

Next, copper foils of 18 μm thick were overlaid on the front and the back surfaces of the above-described prepreg, and a heating and compression forming was conducted at a pressure of 4 MPa, at a temperature of 200 degrees C. for a duration time of 2 hours.

The multiple-layered board having a thickness of 0.1 mm and being copper-cladded on both sides was obtained by the above-described process. Then, through holes were formed in the copper-cladded multiple-layered board by a $CO_2$ laser. Subsequently, the through holes of the copper-cladded multiple-layered board were filled with copper plating by an electrolytic copper plating process, and a circuit pattern formation process was conducted to form the first circuit layer and the second circuit layer.

(Second Insulating Layer and Third Insulating Layer)

Similar configurations as employed in Example 1 were employed for the second insulating layer and the third insulating layer. Then, a circuit board was obtained similarly as in Example 1.

Example 4

Similar configurations as employed in Example 1 were employed for the first insulating layer and the multiple-layered board. Similar configurations as employed in Example 2 were employed for the second insulating layer and the third insulating layer. Then, a circuit board was obtained similarly as in Example 1.

Example 5

A circuit board was produced by a similar process as employed in the above-described Second Embodiment. Similar configurations as employed in Example 3 were employed except the second insulating layer and the third insulating layer.

(Second Insulating Layer and Third Insulating Layer)

Commercially available photosensitive epoxy-modified acryl resin was employed for the second insulating layer and the third insulating layer. This resin varnish was employed to produce the second insulating layer and the third insulating layer by similar method as employed in the aforementioned Second Embodiment. Then, a circuit board was obtained similarly as in Example 1.

(Coefficient of Thermal Expansion)

Coefficients of thermal expansion of the first insulating layer, the second insulating layer and the third insulating layer were measured by the following method.

A thermal mechanical analyzer (commercially available from TA instrument Co., Ltd.) was employed to conduct measurements of 2 cycles, each of which consists of a measurement under the conditions in tensile mode in the nitrogen atmosphere at a temperature ramp rate of 10 degrees C./min. in the temperature range from 25 degrees C. to 300 degrees C. with a load of 5 g. The average coefficient of linear expansion was determined as the average linear coefficient of thermal expansion in the second cycle in the temperature range from 25 degrees C. to the glass transition point. In addition to above, the glass transition point was defined as a peak position of tan δ. Further, resin boards, which were prepared by laminating two of the aforementioned insulating layers obtained as described above and subsequently heating such laminated board in a drier in nitrogen atmosphere at 200 degrees C. for 1 hour to be cured, were employed for evaluation sample specimens to carry out the measurements.

The results are shown in Table 1.

TABLE 1

| | EXAMPLE 1 | EXAMPLE 2 | EXAMPLE 3 | EXAMPLE 4 | EXAMPLE 5 |
|---|---|---|---|---|---|
| FIRST INSULATING LAYER (A) | 7 ppm/° C. | 7 ppm/° C. | 18 ppm/° C. | 18 ppm/° C. | 18 ppm/° C. |
| SECOND INSULATING LAYER (B) | 31 ppm/° C. | 30 ppm/° C. | 31 ppm/° C. | 30 ppm/° C. | 45 ppm/° C. |

TABLE 1-continued

| | EXAMPLE 1 | EXAMPLE 2 | EXAMPLE 3 | EXAMPLE 4 | EXAMPLE 5 |
|---|---|---|---|---|---|
| THIRD INSULATING LAYER (C) | 31 ppm/° C. | 30 ppm/° C. | 31 ppm/° C. | 30 ppm/° C. | 45 ppm/° C. |
| (A − (B)) | 24 ppm/° C. | 23 ppm/° C. | 13 ppm/° C. | 12 ppm/° C. | 27 ppm/° C. |

(Evaluation of Warpage)

The semiconductor chips were suitably arranged by aligning them in predetermined positions of the resin containing the compound having flux function of the obtained circuit board, and a reflow processing was conducted at a peak temperature of 230 degrees C. to achieve a processing for creating junctions and for curing. Thereafter, an encapsulation process using an epoxy resin composition was carried out, and solder balls were installed, and then a dicing process was carried out, and amounts of warpage of segmented semiconductor devices were measured, and if the warpage was equal to or lower than 40 μm (measuring range 15 mm×20 mm), it was determined to be good. Concerning the semiconductor devices obtained by employing the circuit boards obtained in Examples 1 to 5, the amounts of warpages of any of such devices were equal to or lower than 40 μm, and therefore they all were good.

The present application claims priorities based on Japanese patent application No. 2010-071917 filed 26 Mar. 2010 and based on Japanese patent application No. 2010-242628 filed on 28 Oct. 2010, all the contents of which are incorporated hereinto by reference.

The invention claimed is:

1. A semiconductor device, comprising:
a circuit board section; and
a semiconductor chip, disposed over the circuit board section, and having a size substantially equivalent to the size of said circuit board section, viewed from the side of a substrate surface of said circuit board section;
wherein said circuit board comprises:
 a first insulating layer, through which an electric conductor extends;
 a first circuit layer, provided in one side of said first insulating layer and coupled to said electric conductor;
 a second insulating layer, covering said first circuit layer and having an aperture formed over a portion of said first circuit layer;
 a second circuit layer, provided in the other side of said first insulating layer and coupled to said electric conductor;
 a third insulating layer, covering said second circuit layer; and
 a solder layer, provided in the aperture of said second insulating layer, and provided over said first circuit layer,
wherein an average coefficient of thermal expansion (A) of said first insulating layer in the direction along the substrate surface in a temperature range from 25 degrees C. to its glass transition point is equal to or higher than 3 ppm/degrees C. and equal to or lower than 30 ppm/degrees C.,
wherein an average coefficient of thermal expansion (B) of said second insulating, layer in the direction along the substrate surface in a temperature range from 25 degrees C. to its glass transition point is equivalent to all average coefficient of thermal expansion (C) of said third insulating layer in the direction along the substrate surface in a temperature range from 25 degrees C. to its glass transition point,
wherein the average coefficient of thermal expansion (B) of said second insulating layer in the direction along the substrate surface in the temperature range from 25 degrees C. to its glass transition point and the average coefficient of thermal expansion (C) of said third insulating layer in the direction along the substrate surface in the temperature range from 25 degrees C. to its glass transition point are larger than the average coefficient of thermal expansion (A) of said first insulating layer,
wherein a difference between the average coefficient of thermal expansion (A) of said first insulating layer and the average coefficient of thermal expansion (B) of said second insulating layer, and a difference between the average coefficient of thermal expansion (A) of said first insulating layer and the average coefficient of thermal expansion (C) of said third insulating layer are equal to or higher than 5 ppm/degrees C. and equal to or lower than 35 ppm/degrees C., and
wherein a side surface of said circuit board section and a side surface of said semiconductor chip are formed to be coplanar relation.

2. The semiconductor device according to claim 1, wherein said second insulating layer and said third insulating layer of said circuit board section are composed of the same resin composition.

3. The semiconductor device according to claim 1, wherein said circuit board section has a resin layer containing a compound having flux function, and
wherein said resin layer containing the compound having flux function covers said second insulating layer and is provided over said solder layer.

4. The semiconductor device according to claim 1, wherein each of an average coefficient of thermal expansion (B) of said second insulating layer of said circuit board section and an average coefficient of thermal expansion (C) of said the third insulating layer is equal to or higher than 20 ppm/degrees C. and equal to or lower than 40 ppm/degrees C.

5. The semiconductor device according to claim 1, wherein said first insulating layer of said circuit board section contains:
(a) a novolac based epoxy resin;
(b) a curing agent; and
(c) an inorganic filler.

6. The semiconductor device according to claim 1, wherein each of said second insulating layer and said third insulating layer of said circuit board section contains:
(d) a polyfunctional cyanate resin;
(e) a novolac based epoxy resin having condensed aromatic hydrocarbon structure;
(f) a phenoxy resin having bisphenol acetophenone structure represented by the following general formula (1); and
(g) an inorganic filler;

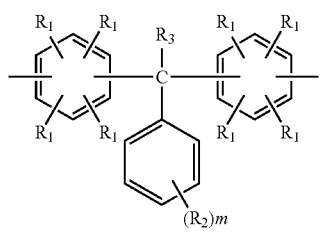

(wherein in the formula (1):
  each of $R_1$ is identical or different, and is a group selected from atomic hydrogen, hydrocarbon group of having equal to or more than 1 and equal to or less than 10 carbon atoms and halogen;
  $R_2$ is a group selected from atomic hydrogen, hydrocarbon group having equal to or more than 1 and equal to or less than 10 carbon atoms and halogen; and
  $R_3$ is atomic hydrogen or hydrocarbon group having equal to or more than and equal to or less than 10 carbon atoms; and
  m is an integer number of 0 to 5.

7. The semiconductor device according to claim 1, wherein each of said second insulating layer and said third insulating layer of said circuit board section contains a photosensitive polymer.

8. The semiconductor device according to claim 1, wherein said first insulating layer of said circuit board section is obtained by impregnating an inorganic base material with an insulating resin, and wherein said second insulating layer and said third insulating layer contains no inorganic base material.

9. The semiconductor device according to claim 1, wherein T1/T2, which is a ratio of a thickness of said second insulating layer (T1) and a thickness of said third insulating layer (T2), is equal to or higher than 1.

10. A method for producing a semiconductor device, including:
  producing a circuit hoard;
  disposing a plurality of semiconductor chips over said circuit board; and
  segmenting said circuit board to obtain circuit board sections, thereby obtaining a plurality of semiconductor devices comprising said semiconductor chip and said circuit board section,
  said producing the circuit board includes:
    preparing a first insulating layer, said first insulating layer having an electric conductor extending through the inside thereof, being provided in the side of one surface thereof with a first circuit layer coupled to said electric conductor and being provided in the side of the other surface thereof with a second circuit layer coupled to said electric conductor;
    providing a second insulating layer covering said first circuit layer;
    providing a third insulating layer covering said second circuit layer;
    forming an aperture in said second insulating layer, a section of said first circuit layer being exposed through said aperture; and
    providing a solder layer in said aperture,
  wherein an average coefficient of thermal expansion (A) of said first insulating layer in the direction along a substrate surface in a temperature range from 25 degrees C. to its glass transition point is equal to or higher than 3 ppm/degrees C. and equal to or lower than 30 ppm/degrees C.,
  wherein an average coefficient of thermal expansion (B) of said second insulating layer in the direction along the substrate surface in a temperature range from 25 degrees C. to its glass transition point is equivalent to an average coefficient of thermal expansion (C) of said third insulating layer in the direction along the substrate surface in a temperature range from 25 degrees C. to glass transition point,
  wherein the average coefficient of thermal expansion (B) of said second insulating layer in the direction along the substrate surface in the temperature range from 25 degrees C. to its glass transition point and the average coefficient of thermal expansion (C) of said third insulating layer in the direction along the substrate surface in the temperature range from 25 degrees C. to its glass transition point are larger than the average coefficient of thermal expansion (A) of said first insulating layer,
  wherein a difference between the average coefficient of thermal expansion (A) of said first insulating layer and the average coefficient of thermal expansion (B) of said second insulating layer, and a difference between the average coefficient of thermal expansion (A) of said first insulating layer and the average coefficient of thermal expansion (C) of said third insulating layer are equal to or higher than 5 ppm/degrees C. and equal to or lower than 35 ppm/degrees C., and
  wherein, in said segmenting the circuit hoard, a semiconductor device where a side surface of said circuit board section and a side surface of said semiconductor chip are in coplanar relation is obtained.

* * * * *